(12) United States Patent
Katsuno et al.

(10) Patent No.: US 9,337,396 B2
(45) Date of Patent: May 10, 2016

(54) SEMICONDUCTOR LIGHT EMITTING DEVICE

(71) Applicant: Kabushiki Kaisha Toshiba, Minato-ku (JP)

(72) Inventors: Hiroshi Katsuno, Tokyo (JP); Satoshi Mitsugi, Kanagawa-ken (JP); Toshihide Ito, Tokyo (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/173,954

(22) Filed: Feb. 6, 2014

(65) Prior Publication Data
US 2014/0225141 A1     Aug. 14, 2014

(30) Foreign Application Priority Data

Feb. 8, 2013    (JP) .................................. 2013-023653

(51) Int. Cl.
| | |
|---|---|
| *H01L 33/38* | (2010.01) |
| *H01L 33/40* | (2010.01) |
| *H01L 33/46* | (2010.01) |
| *H01L 33/00* | (2010.01) |

(52) U.S. Cl.
CPC .............. *H01L 33/405* (2013.01); *H01L 33/46* (2013.01); *H01L 33/0079* (2013.01); *H01L 33/38* (2013.01); *H01L 2933/0016* (2013.01)

(58) Field of Classification Search
CPC ....... H01L 33/36; H01L 33/38; H01L 33/405; H01L 33/44; H01L 33/46
See application file for complete search history.

(56) References Cited

U.S. PATENT DOCUMENTS

| | | | |
|---|---|---|---|
| 2003/0141506 A1 | 7/2003 | Sano et al. | |
| 2007/0246735 A1* | 10/2007 | Yahata et al. | ................. 257/103 |
| 2012/0018764 A1* | 1/2012 | Choi et al. | ...................... 257/99 |

(Continued)

FOREIGN PATENT DOCUMENTS

| | | |
|---|---|---|
| CN | 102655197 A | 9/2012 |
| EP | 2 219 240 | 8/2010 |

(Continued)

OTHER PUBLICATIONS

W.M. Haynes, CRC Handbook of Chemistry and Physics, Optical Properties of Selected Elements, 98th Edition, Internet Version 2015, pp. 12-126 to 12-150.*
Taiwanese Office Action issue Jul. 31, 2015 in Taiwanese Patent Application No. 103104068 with English translation.
European Search Report issued Oct. 6, 2015, in European Patent Application No. 14154200.1.

(Continued)

*Primary Examiner* — Yu Chen
(74) *Attorney, Agent, or Firm* — Oblon, McClelland, Maier & Neustadt, L.L.P.

(57) ABSTRACT

According to one embodiment, a semiconductor light emitting device includes a first metal layer, a second metal layer, a third metal layer, a semiconductor light emitting unit and an insulating unit. The semiconductor light emitting unit is separated from the first metal layer in a first direction. The second metal layer is provided between the first metal layer and the semiconductor light emitting unit to be electrically connected to the first metal layer, and is light-reflective. The second metal layer includes a contact metal portion, and a peripheral metal portion. The third metal layer is light-reflective. The third metal layer includes an inner portion, a middle portion, and an outer portion. The insulating unit includes an first insulating portion, a second insulating portion, and a third insulating portion.

19 Claims, 6 Drawing Sheets

(56) References Cited

U.S. PATENT DOCUMENTS

| | | | |
|---|---|---|---|
| 2012/0138984 A1* | 6/2012 | Kamiya et al. | 257/98 |
| 2012/0235168 A1* | 9/2012 | Katsuno et al. | 257/88 |

FOREIGN PATENT DOCUMENTS

| | | |
|---|---|---|
| EP | 2 495 761 | 9/2012 |
| JP | 2011-86899 | 4/2011 |
| TW | 201114064 A | 4/2011 |

OTHER PUBLICATIONS

U.S. Appl. No. 13/729,563, filed Dec. 28, 2012, Hiroshi Katsuno et al.

T. Fujii et al. "Increase in the extraction efficiency of GaN-based light-emitting diodes via surface roughening", Applied Physics Letters, vol. 84, No. 6, Feb. 9, 2004, 3 pages.

Office Action issued on Feb. 26, 2016 in Chinese Patent Application No. 201410046022.1, with English translation. (16 pages).

* cited by examiner

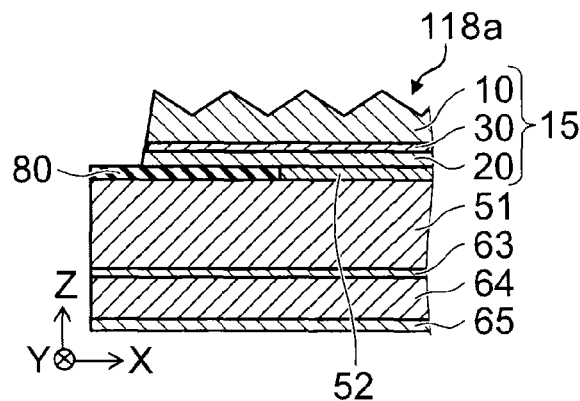
FIG. 2
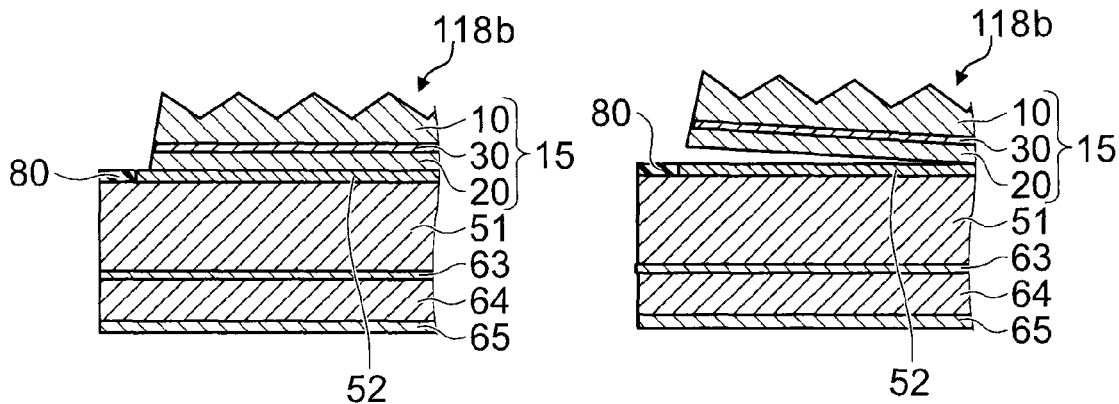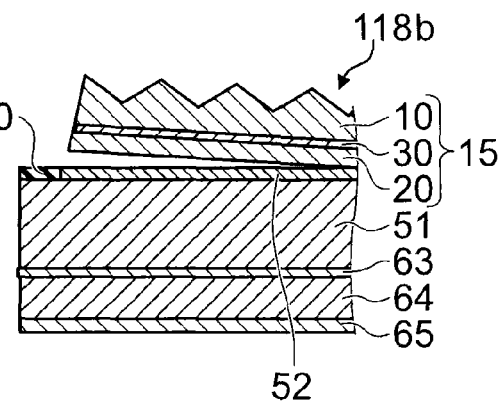
FIG. 3A FIG. 3B
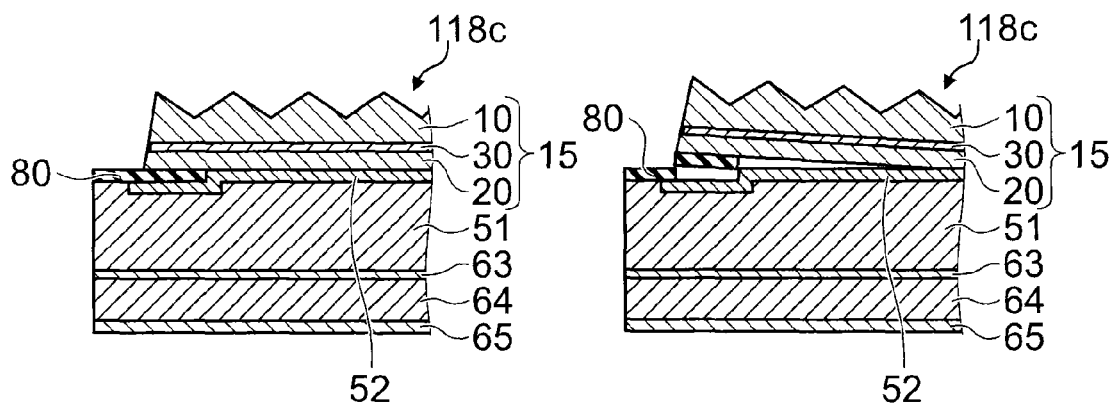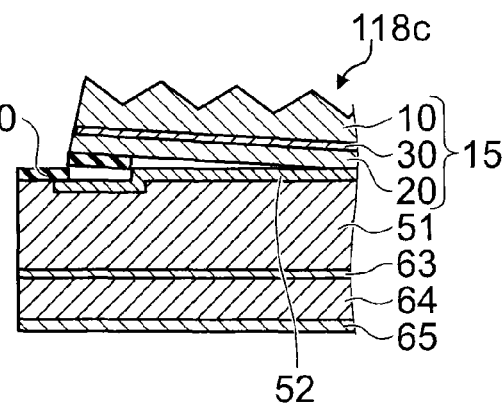
FIG. 4A FIG. 4B

SEMICONDUCTOR LIGHT EMITTING DEVICE

CROSS-REFERENCE TO RELATED APPLICATIONS

This application is based upon and claims the benefit of priority from Japanese Patent Application No. 2013-023653, filed on Feb. 8, 2013; the entire contents of which are incorporated herein by reference.

FIELD

Embodiments described herein relate generally to a semiconductor light emitting device.

BACKGROUND

In one structure of a semiconductor light emitting device such as an LED (Light Emitting Diode) or the like, for example, a crystal layer is formed on a growth substrate and bonded to an electrically conductive substrate, after which the growth substrate is removed. In such a structure, the light extraction efficiency can be increased by making an unevenness in the surface of the crystal layer exposed by the removal of the growth substrate. Also, there is a structure in which a p-side electrode and an n-side electrode are formed on the crystal surface on the side opposite to where the surface where the substrate was removed; and electrodes are not formed at the surface of the crystal layer used as the light extraction surface. In such a semiconductor light emitting device, it is desirable to increase the luminous efficiency further.

BRIEF DESCRIPTION OF THE DRAWINGS

FIG. 2 is a schematic cross-sectional view showing a semiconductor light emitting device of a first reference example;

FIG. 3A and FIG. 3B are schematic cross-sectional views showing a semiconductor light emitting device of a second reference example;

FIG. 4A and FIG. 4B are schematic cross-sectional views showing a semiconductor light emitting device of a third reference example;

DETAILED DESCRIPTION

Figure 1A:
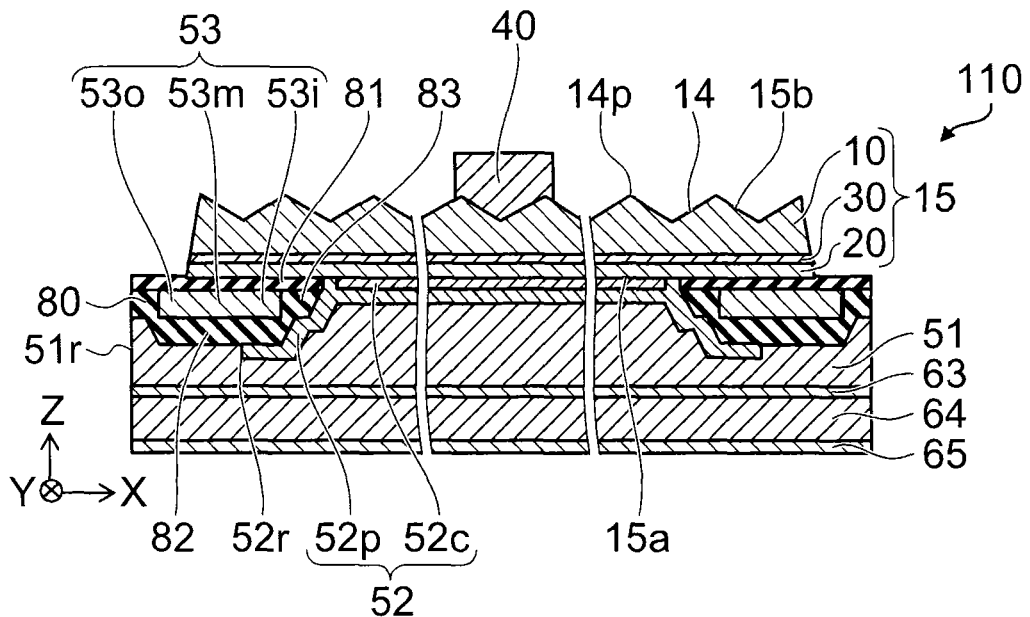
FIG. 1A and FIG. 1B are schematic views showing a semiconductor light emitting device according to a first embodiment.

According to one embodiment, a semiconductor light emitting device includes a first metal layer, a second metal layer, a third metal layer, a semiconductor light emitting unit and an insulating unit. The semiconductor light emitting unit is separated from the first metal layer in a first direction. The second metal layer is provided between the first metal layer and the semiconductor light emitting unit to be electrically connected to the first metal layer, and is light-reflective. The second metal layer includes a contact metal portion contacting the semiconductor light emitting unit, and a peripheral metal portion provided around the contact metal portion when projected onto a plane perpendicular to the first direction, the peripheral metal portion having an outer edge portion separated from the semiconductor light emitting unit. The third metal layer is light-reflective. The third metal layer includes an inner portion provided between the semiconductor light emitting unit and the outer edge portion, a middle portion overlapping the semiconductor light emitting unit and not overlapping the outer edge portion when projected onto the plane, and an outer portion outside the semiconductor light emitting unit when projected onto the plane. The insulating unit includes an first insulating portion provided between the middle portion and the semiconductor light emitting unit and between the inner portion and the semiconductor light emitting unit, a second insulating portion provided between the inner portion and the first metal layer and between the outer portion and the first metal layer, and a third insulating portion continuous with the first insulating portion and the second insulating portion.

According to one embodiment, a semiconductor light emitting device includes a first metal layer, a second metal layer, a third metal layer, a semiconductor light emitting unit, and an insulating unit. The semiconductor light emitting unit is separated from the first metal layer in a first direction. The second metal layer is provided between the first metal layer and the semiconductor light emitting unit to contact the first metal layer and the semiconductor light emitting unit, and is light-reflective. The second metal layer includes a contact metal portion contacting the semiconductor light emitting unit, and a peripheral metal portion having an outer edge portion provided around the contact metal portion when projected onto a plane perpendicular to the first direction. The third metal layer is light-reflective. The third metal layer includes an inner portion provided between the outer edge portion and the first metal layer, a middle portion overlapping the semiconductor light emitting unit and not overlapping the outer edge portion when projected onto the plane, and an outer portion outside the semiconductor light emitting unit when projected onto the plane. The insulating unit includes a first insulating portion provided between the middle portion and the semiconductor light emitting unit, a second insulating portion provided between the inner portion and the outer edge portion and between the outer edge portion and the first metal layer, and a third insulating portion continuous with the first insulating portion and the second insulating portion.

Embodiments of the invention will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
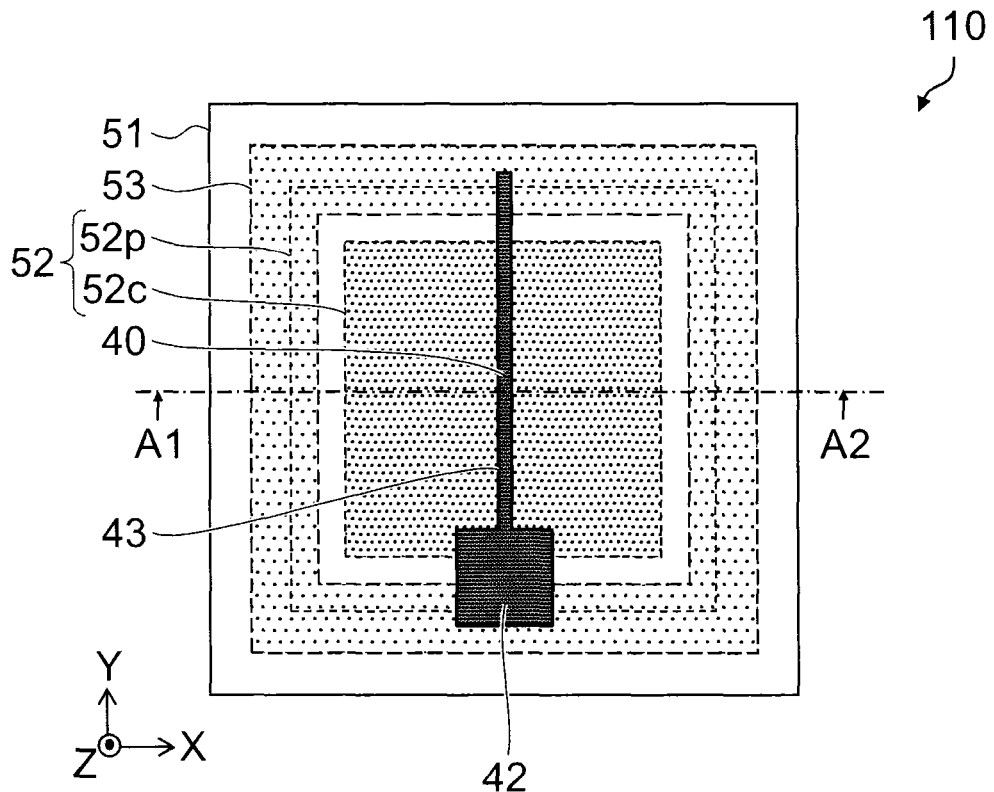

FIG. 1A and FIG. 1B are schematic views illustrating a semiconductor light emitting device according to a first embodiment.

FIG. 1B is a plan view; and FIG. 1A is a cross-sectional view along line A1-A2 of FIG. 1B. FIG. 1B is a schematic transparent view; and the insulating portions are not shown in FIG. 1B.

As shown in FIG. 1A and FIG. 1B, the semiconductor light emitting device 110 according to the embodiment includes a first metal layer 51, a second metal layer 52, a third metal layer 53, and a semiconductor light emitting unit 15.

In the example, a support substrate 64 is provided on a back surface electrode 65; a bonding layer 63 is provided on the support substrate 64; and the first metal layer 51 is provided on the bonding layer 63.

In the specification of the application, the state of being provided on includes not only the state of being provided in direct contact but also the state in which another component is inserted therebetween.

The support substrate 64 and the bonding layer 63 are electrically conductive. The back surface electrode 65 is connected to the first metal layer 51 via the support substrate 64 and the bonding layer 63.

The second metal layer 52 is provided on the first metal layer 51. The first metal layer 51 is disposed between the support substrate 64 and the semiconductor light emitting unit 15; and the support substrate 64 and the second metal layer 52 are electrically connected to each other via the first metal layer 51.

In the example, the second metal layer 52 is provided at a central portion of the planar configuration of the first metal layer 51. The second metal layer 52 has a contact metal portion 52c and a peripheral metal portion 52p having a portion (an outer edge portion 52r) provided around the contact metal portion 52c.

The semiconductor light emitting unit 15 is provided on the second metal layer 52. The semiconductor light emitting unit 15 has a portion disposed on at least the contact metal portion 52c. The contact metal portion 52c contacts the semiconductor light emitting unit 15.

The direction from the first metal layer 51 toward the semiconductor light emitting unit 15 is taken as a first direction (a Z-axis direction). The semiconductor light emitting unit 15 is separated from the first metal layer 51 in the first direction.

One direction perpendicular to the Z-axis direction is taken as an X-axis direction. A direction perpendicular to the Z-axis direction and the X-axis direction is taken as a Y-axis direction.

In the example, the configuration of the first metal layer 51 when projected onto the X-Y plane (a plane perpendicular to the first direction) is a rectangle. One side of the rectangle is parallel to the X-axis direction; and one other side is parallel to the Y-axis direction. In the example, the configuration of the semiconductor light emitting unit 15 when projected onto the X-Y plane is a rectangle. One side of the rectangle is parallel to the X-axis direction; and one other side is parallel to the Y-axis direction. However, in the embodiment, the configurations of the first metal layer 51 and the semiconductor light emitting unit 15 are arbitrary.

The semiconductor light emitting unit 15 includes a first semiconductor layer 10 of a first conductivity type, a second semiconductor layer 20 of a second conductivity type, and a light emitting layer 30. In the example, the second semiconductor layer 20 is provided between the first semiconductor layer 10 and the contact metal portion 52c. The light emitting layer 30 is provided between the first semiconductor layer 10 and the second semiconductor layer 20.

For example, the first conductivity type is the n type; and the second conductivity type is the p type. In the embodiment, the first conductivity type may be the p type; and the second conductivity type may be the n type. In the following example, the first conductivity type is the n type; and the second conductivity type is the p type.

In the example, the second metal layer 52 is used as a p-side electrode. The second metal layer 52 is light-reflective.

On the other hand, an electrode layer 40 is provided on the semiconductor light emitting unit 15, that is, on the first semiconductor layer 10. In other words, the semiconductor light emitting unit 15 is disposed between the electrode layer 40 and the first metal layer 51. The electrode layer 40 is connected to the semiconductor light emitting unit 15 (specifically, the first semiconductor layer 10). The electrode layer 40 functions as an n-side electrode.

As shown in FIG. 1B, the electrode layer 40 is connected to a pad portion 42.

A current is supplied to the light emitting layer 30 via the first metal layer 51, the second metal layer 52, the second semiconductor layer 20, the electrode layer 40, and the first semiconductor layer 10 by applying a voltage between the back surface electrode 65 and the pad portion 42. Thereby, light is emitted from the light emitting layer 30.

The light that is emitted outside the device is emitted mainly in the upward direction. In other words, a portion of the light emitted from the light emitting layer 30 travels as-is in the upward direction and is emitted outside the device. On the other hand, another portion of the light emitted from the light emitting layer 30 is efficiently reflected by the second metal layer 52 which is light-reflective, travels in the upward direction, and is emitted outside the device. In the example as described below, the light also is reflected by the third metal layer 53 to be emitted outside the device.

For example, as shown in FIG. 1A, the semiconductor light emitting unit 15 has a first surface 15a (the lower surface) on the first metal layer 51 side and a second surface 15b (the upper surface) on the side opposite to the first surface 15a (the side opposite to the first metal layer 51). The light emitted from the semiconductor light emitting unit 15 is extracted mainly from the second surface 15b of the semiconductor light emitting unit 15. In other words, the light of the semiconductor light emitting device 110 is emitted outside the device from the second surface 15b. For example, the intensity of the light emitted from the semiconductor light emitting unit 15 to be emitted from the surface (the second surface 15b) of the semiconductor light emitting unit 15 on the side opposite to the first metal layer 51 is higher than the intensity of the light emitted from the semiconductor light emitting unit 15 to be emitted from the surface (the first surface 15a) of the semiconductor light emitting unit 15 on the first metal layer 51 side.

The third metal layer 53 (illustrated by the rough dots in FIG. 1B) that is light-reflective is provided in the semiconductor light emitting device 110. The third metal layer 53 is provided along a peripheral portion of the semiconductor light emitting unit 15. The third metal layer 53 overlaps the second metal layer 52 when projected onto the X-Y plane. The third metal layer 53 also overlaps the peripheral portion of the semiconductor light emitting unit 15 when projected onto the X-Y plane. When projected onto the X-Y plane, the central portion of the semiconductor light emitting unit 15 overlaps the second metal layer 52 which is light-reflective; and the peripheral portion of the semiconductor light emitting unit 15 overlaps the third metal layer 53 which is light-reflective.

In the semiconductor light emitting device 110, the entire surface of the semiconductor light emitting unit 15 overlaps metal layers (the second metal layer 52 and the third metal layer 53) that are light-reflective. Therefore, the light emitted from the semiconductor light emitting unit 15 can be reflected by these metal layers to travel in the upward direction. The light does not leak to the lower side (the support substrate 64 side) of the device. Thereby, the light extraction efficiency can be increased.

The third metal layer 53 which is light-reflective may include, for example, at least one selected from aluminum (Al) and silver (Ag). The third metal layer 53 may include, for example, an Al film, a Ag film, or an alloy film including at least one selected from Al and Ag.

The second metal layer 52 which is light-reflective also may include, for example, at least one selected from Al and Ag. The second metal layer 52 may include, for example, an Al film, a Ag film, or an alloy film including at least one selected from Al and Ag. It is favorable for the contact resistance of the contact metal portion 52c of the second metal layer 52 to be low. To this end, the contact metal portion 52c may include a material that is different from the portion (the peripheral metal portion 52p) other than the contact metal portion 52c.

The inventor of the application discovered that the adhesion is poor for such materials (Al, Ag, etc.) having high optical reflectances. In particular, it was ascertained that the semiconductor light emitting unit 15 or the third metal layer 53 undesirably peels in the case where these materials are used as the third metal layer 53 provided along the peripheral portion of the semiconductor light emitting unit 15 because the adhesion of the third metal layer 53 is low.

In other words, it was found that peeling occurs in the case where the third metal layer 53 which is light-reflective is provided along the peripheral portion of the semiconductor light emitting unit 15 to increase the light extraction efficiency; and it is difficult to obtain a practical semiconductor light emitting device.

The embodiment solves this newly-discovered problem.

The semiconductor light emitting device 110 according to the embodiment includes the first metal layer 51, the second metal layer 52, the third metal layer 53, the semiconductor light emitting unit 15, and an insulating unit 80.

The semiconductor light emitting unit 15 is separated from the first metal layer 51 in the first direction (the Z-axis direction).

A metal having low reflectance and good adhesion may be used on the semiconductor light emitting unit 15 side of the first metal layer 51. For such a metal having good adhesion, the adhesion with the second metal layer 52, the third metal layer 53, and the insulating unit 80 is good. The metal may include, for example, Ti (titanium) or TiW (titanium-tungsten).

The second metal layer 52 is provided between the first metal layer 51 and the semiconductor light emitting unit 15. The second metal layer 52 is electrically connected to the first metal layer 51 and is light-reflective. The optical reflectance of the second metal layer 52 is higher than the optical reflectance of the first metal layer 51. The second metal layer 52 has the contact metal portion 52c and the peripheral metal portion 52p. The contact metal portion 52c contacts the semiconductor light emitting unit 15. The peripheral metal portion 52p is provided around the contact metal portion 52c when projected onto the plane) perpendicular to the X-Y plane (the first direction. The peripheral metal portion 52p has the outer edge portion 52r. The outer edge portion 52r is separated from the semiconductor light emitting unit 15.

The third metal layer 53 is light-reflective. The optical reflectance of the third metal layer 53 is higher than the optical reflectance of the first metal layer 51. As shown in FIG. 1A, the third metal layer 53 has an inner portion 53i, a middle portion 53m, and an outer portion 53o. The inner portion 53i is provided between the semiconductor light emitting unit 15 and the outer edge portion 52r. The middle portion 53m overlaps the semiconductor light emitting unit 15 and does not overlap the outer edge portion 52r when projected onto the X-Y plane. The outer portion 53o is outside the semiconductor light emitting unit 15 when projected onto the X-Y plane.

The insulating unit 80 has first to third insulating portions 81 to 83. The first insulating portion 81 is provided between the middle portion 53m and the semiconductor light emitting unit 15 and between the inner portion 53i and the semiconductor light emitting unit 15. The second insulating portion 82 is provided between the inner portion 53i and the first metal layer 51 and between the outer portion 53o and the first metal layer 51. In this example, the second insulating portion 82 is further provided between the middle portion 53m and first metal layer 51. The third insulating portion 83 is continuous with the first insulating portion 81 and the second insulating portion 82. The third insulating portion 83 is provided between the inner portion 53i and the second metal layer 52. There are the cases where the boundary between the first to third insulating portions 81 to 83 is observed; and there are the cases where the boundary is not observed.

In the example, the first insulating portion 81 extends to an outer edge 51r of the first metal layer 51 when projected onto the X-Y plane. The outer portion 53o of the third metal layer 53 is disposed between the first insulating portion 81 and the first metal layer 51. The outer portion 53o is disposed between the first insulating portion 81 and the second insulating portion 82.

The insulating unit 80 (the first to third insulating portions 81 to 83) includes, for example, a dielectric, etc. Specifically, the insulating unit 80 (the first to third insulating portions 81 to 83) may include silicon oxide, silicon nitride, or silicon oxynitride. An oxide of at least one metal selected from Al, Zr, Ti, Nb, and Hf, a nitride of the at least one metal recited above, or an oxynitride of the at least one metal recited above may be used.

Thus, the adhesion between the semiconductor light emitting unit 15 (the semiconductor layer) and the dielectric used as the insulating unit 80 is higher (better) than the adhesion between the semiconductor light emitting unit 15 and the metal (Al or Ag) having the high light reflectance used as the third metal layer 53.

In other words, in the embodiment, the adhesion between the insulating unit 80 and the semiconductor light emitting unit 15 is higher (better) than the adhesion between the third metal layer 53 and the semiconductor light emitting unit 15. The adhesion between the insulating unit 80 and the first metal layer 51 is higher (better) than the adhesion between the insulating unit 80 and the third metal layer 53. In other words, the adhesion between the second metal layer 52 and the semiconductor light emitting unit 15 is low; and the adhesion between the second metal layer 52 and the insulating unit 80 also is low. The adhesion between the third metal layer 53 and the semiconductor light emitting unit 15 is low; and the adhesion between the third metal layer 53 and the insulating unit 80 also is low. On the other hand, the adhesion between the insulating unit 80 and the semiconductor light emitting unit 15 is high. In the embodiment, the peeling of the semiconductor light emitting unit 15 from the first metal layer 51 is suppressed because the insulating unit 80 links the first metal layer 51 to the semiconductor light emitting unit 15.

Thus, in the embodiment, the peeling can be suppressed by providing the insulating unit 80 having good adhesion to include the first to third insulating portions 81 to 83. According to the embodiment, a practical semiconductor light emitting device having high luminous efficiency can be provided.

As recited above, the semiconductor light emitting device 110 includes a stacked body (the semiconductor light emitting unit 15) including the first semiconductor layer 10 (e.g., the n-type semiconductor layer), the second semiconductor layer 20 (e.g., the p-type semiconductor layer), and the light emitting layer 30 provided between the first semiconductor layer 10 and the second semiconductor layer 20. The electrode layer 40 (e.g., the n-side electrode) is provided on the major surface (the second surface 15b) of the stacked body on the first semiconductor layer 10 side. The contact metal portion 52c (the p-side electrode) is provided on the major surface (the first surface 15a) of the stacked body on the second semiconductor layer 20 side. Further, the peripheral metal portion 52p that is electrically connected to the contact metal portion 52c is provided. As described below, the contact metal portion 52c and the peripheral metal portion 52p (i.e., the second metal layer 52) may be integral. Further, the third metal layer 53 is provided. The third metal layer 53 has portions (the inner portion 53i and the middle portion 53m) at a periphery including the end portion of the stacked body in a region where the stacked body does not contact the contact metal portion 52c when projected onto the X-Y plane. The peripheral metal portion 52p covers the third metal layer 53 with the second insulating portion 82 interposed. The outer edge of the peripheral metal portion 52p is positioned inside the outer edge of the stacked body when projected onto the X-Y plane. Further, the first insulating portion 81 is provided between the third metal layer 53 and the stacked body in the region where the stacked body does not contact the contact metal portion 52c.

In the semiconductor light emitting device 110, the second metal layer 52 (the contact metal portion 52c and the peripheral metal portion 52p) and the third metal layer 53 are light-reflective. When viewed from the Z-axis direction, a reflective film having high reflectance is disposed in the region overlapping the stacked body. Thereby, the extraction efficiency can be maximized.

Also, the peeling is suppressed because the stacked body (the semiconductor light emitting unit 15) is connected to the first metal layer 51 by the insulating unit 80 which has good adhesion. According to the semiconductor light emitting device 110, a practical semiconductor light emitting device having high luminous efficiency can be provided.

FIG. 2 is a schematic cross-sectional view showing a semiconductor light emitting device of a first reference example.

FIG. 2 shows the cross section of a portion of the peripheral portion of the semiconductor light emitting device. As shown in FIG. 2, the third metal layer 53 is not provided in the semiconductor light emitting device 118a of the first reference example. The second metal layer 52 that is connected to the semiconductor light emitting unit 15 is arranged with the insulating unit 80. In the semiconductor light emitting device 118a, the second metal layer 52 is disposed inside the semiconductor light emitting unit 15 when projected onto the X-Y plane. In other words, the outer edge of the semiconductor light emitting unit 15 contacts the insulating unit 80 which has good adhesion. Therefore, peeling does not occur easily. However, a portion of the outer edge portion of the semiconductor light emitting unit 15 does not overlap a reflective film (the second metal layer 52) having high reflectance when projected onto the X-Y plane. Accordingly, the light emitted from the portion of the outer edge portion of the semiconductor light emitting unit 15 is incident on the first metal layer 51 via the insulating unit 80 and is absorbed. Therefore, in the semiconductor light emitting device 118a, the light extraction efficiency is low; and the luminous efficiency is low.

FIG. 3A and FIG. 3B are schematic cross-sectional views showing a semiconductor light emitting device of a second reference example.

These drawings show the cross section of a portion of the peripheral portion of the semiconductor light emitting device. FIG. 3A shows the configuration of the semiconductor light emitting device 118b of the second reference example. FIG. 3B shows the state in which peeling occurs. As shown in FIG. 3A, in the semiconductor light emitting device 118b as well, the third metal layer 53 is not provided. In the semiconductor light emitting device 118b, the second metal layer 52 extends outside the semiconductor light emitting unit 15 when projected onto the X-Y plane. The insulating unit 80 is provided outside the semiconductor light emitting unit 15. The second metal layer 52 is arranged with the insulating unit 80; and the second metal layer 52 does not overlap the insulating unit 80. In the semiconductor light emitting device 118b, the entire semiconductor light emitting unit 15 overlaps a reflective film (the second metal layer 52) having high reflectance when projected onto the X-Y plane. Accordingly, the light extraction efficiency is high. However, the outer edge of the semiconductor light emitting unit 15 contacts the second metal layer 52 which has poor adhesion. Therefore, as shown in FIG. 3B, peeling occurs between the second metal layer 52 and the semiconductor light emitting unit 15. In other words, for example, the semiconductor light emitting unit 15 peels from the second metal layer 52 due to the stress accumulating in the interior of the semiconductor light emitting unit 15 because the adhesion between the second metal layer 52 (e.g., the Ag layer) and the semiconductor light emitting unit 15 (e.g., the GaN layer) is poor.

FIG. 4A and FIG. 4B are schematic cross-sectional views showing a semiconductor light emitting device of a third reference example.

These drawings show the cross section of a portion of the peripheral portion of the semiconductor light emitting device. FIG. 4A shows the configuration of the semiconductor light emitting device 118c of the third reference example. FIG. 4B shows the state in which peeling occurs. As shown in FIG. 4A, in the semiconductor light emitting device 118c as well, the third metal layer 53 is not provided. In the semiconductor light emitting device 118c, the second metal layer 52 extends outside the semiconductor light emitting unit 15 when projected onto the X-Y plane. In such a case, the second metal layer 52 covers a portion of the insulating unit 80; and the second metal layer 52 extends between the insulating unit 80 and the first metal layer 51. In the semiconductor light emitting device 118c, the entire semiconductor light emitting unit 15 overlaps a reflective film (the second metal layer 52) having high reflectance when projected onto the X-Y plane. Accordingly, the light extraction efficiency is high. The outer edge of the semiconductor light emitting unit 15 contacts the insulating unit 80 which has good adhesion. Therefore, peeling between the semiconductor light emitting unit 15 and the insulating unit 80 does not occur easily. However, as shown in FIG. 4B, peeling occurs between the second metal layer 52 and the insulating unit 80. In other words, peeling occurs between the second metal layer 52 and the insulating unit 80 and between the semiconductor light emitting unit 15 and the second metal layer 52 due to the stress accumulating in the interior of the semiconductor light emitting unit 15 because the adhesion between the second metal layer 52 (e.g., the Ag layer) and the insulating unit 80 (e.g., the SiO₂ layer) is poor.

Figure 5:
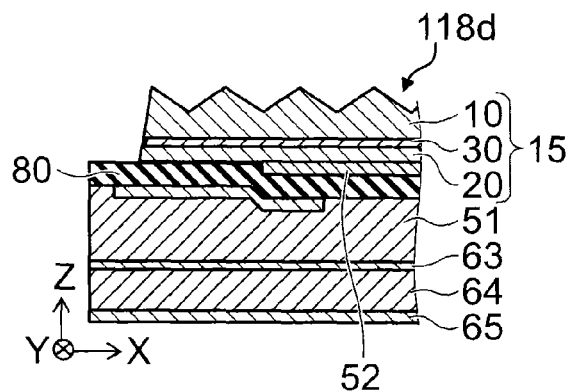
FIG. 5 is a schematic cross-sectional view showing a semiconductor light emitting device of a fourth reference example.

FIG. 5 is a schematic cross-sectional view showing a semiconductor light emitting device of a fourth reference example.

FIG. 5 shows the cross section of a portion of the peripheral portion of the semiconductor light emitting device. In the semiconductor light emitting device 118d of the fourth reference example as shown in FIG. 5, the insulating unit 80 covers the second metal layer 52. In other words, the insulating unit 80 is provided continuously between the first metal layer 51 and the outer edge of the semiconductor light emitting unit 15 and between the second metal layer 52 and the first metal layer 51. The outer edge of the semiconductor light emitting unit 15 contacts the insulating unit 80. The third metal layer 53 is disposed between the first metal layer 51 and the insulating unit 80. The outer edge of the second metal layer 52 when projected onto the X-Y plane is inside the outer edge of the semiconductor light emitting unit 15. The third metal layer 53 overlaps the second metal layer 52 and overlaps the outer edge of the semiconductor light emitting unit 15 when projected onto the X-Y plane. The semiconductor light emitting unit 15 overlaps a reflective film having high reflectance, i.e., at least one selected from the second metal layer 52 and the third metal layer 53, when projected onto the X-Y plane. Therefore, the light extraction efficiency is high. A portion of the insulating unit 80 contacts the semiconductor light emitting unit 15; and another portion of the insulating unit 80 contacts the first metal layer 51. Peeling does not occur easily because the semiconductor light emitting unit 15 and the first metal layer 51 are bonded to each other by the insulating unit 80.

However, in the semiconductor light emitting device 118d, the insulating unit 80 is provided between the second metal layer 52 and the first metal layer 51. The insulating unit 80 includes a dielectric, etc.; and the thermal conductivity of the insulating unit 80 is lower than the thermal conductivity of a metal. Therefore, in the semiconductor light emitting device 118d, the heat that is generated directly above the second metal layer 52 is not conducted easily toward the first metal layer 51 and the support substrate 64; and the heat dissipation is poor. Therefore, the luminous efficiency is low. Or, the reliability of the device is low; and the life is short.

Conversely, in the semiconductor light emitting device 110 according to the embodiment, the semiconductor light emitting unit 15 overlaps a reflective film having high reflectance (at least one selected from the second metal layer 52 and the third metal layer 53). Thereby, the light extraction efficiency is high. Further, a portion (the first insulating portion 81) of the insulating unit 80 contacts the semiconductor light emitting unit 15; another portion (the second insulating portion 82) of the insulating unit 80 contacts the first metal layer 51; and the two portions are continuous via the third insulating portion 83. Peeling does not occur easily because the semiconductor light emitting unit 15 and the first metal layer 51 are bonded to each other by the insulating unit 80. Moreover, the insulating unit 80 is not provided between the second metal layer 52 and the first metal layer 51. In other words, the second metal layer 52 (at least a portion of the second metal layer 52) contacts the first metal layer 51. Therefore, the heat dissipation is good; and high luminous efficiency is obtained. Also, the reliability is high.

Examples of the configuration of the semiconductor light emitting device 110 according to the embodiment will now be described further.

The first semiconductor layer 10, the second semiconductor layer 20, and the light emitting layer 30 include nitride semiconductors. The first semiconductor layer 10, the second semiconductor layer 20, and the light emitting layer 30 include, for example, $Al_xGa_{1-x-y}In_yN$ (x≥0, y≥0, and x+y≤1).

The first semiconductor layer 10 includes, for example, a Si-doped n-type GaN contact layer and a Si-doped n-type AlGaN clad layer. The Si-doped n-type AlGaN clad layer is disposed between the Si-doped n-type GaN contact layer and the light emitting layer 30. The first semiconductor layer 10 may further include a GaN buffer layer; and the Si-doped n-type GaN contact layer is disposed between the GaN buffer layer and the Si-doped n-type AlGaN clad layer. In such a case, an opening is provided in the GaN buffer layer; and the electrode layer 40 is connected to the Si-doped n-type GaN contact layer via the opening.

The light emitting layer 30 has, for example, a multiple quantum well (MQW) structure. For example, multiple barrier layers are stacked alternately with multiple well layers in the MQW structure.

In the specification of the application, the state of being stacked includes not only the state of being in direct contact but also the state in which another component is inserted therebetween.

The number of the well layers is, for example, six; and the number of the barrier layers is, for example, seven. In the MQW structure, the period of the stacking is, for example, six. For example, the thickness of the light emitting layer 30 is not less than 25 nm (nanometers) and not more than 200 nm, e.g., about 75 nm.

For example, the well layer includes AlGaInN. For example, the well layer includes GaInN. The thickness of the well layer is, for example, not less than 2 nm and not more than 20 nm.

The barrier layer includes, for example, Si-doped n-type AlGaN. For example, the barrier layer includes Si-doped n-type $Al_{0.11}Ga_{0.89}N$. The Si concentration of the barrier layer of Si-doped n-type $Al_{0.11}Ga_{0.89}N$, is, for example, not less than $1.1 \times 10^{19}$ cm⁻³ and not more than $1.5 \times 10^{19}$ cm⁻³. The thickness of the barrier layer is, for example, not less than 2 nm and not more than 30 nm. The barrier layer (the p-side barrier layer) of the multiple barrier layers most proximal to the second semiconductor layer 20 may be different from the other barrier layers, and may be thicker or thinner. The thickness of the p-side barrier layer is, for example, 10 nm.

The wavelength (the peak wavelength) of the light (the emitted light) emitted from the light emitting layer 30 is, for example, not less than 210 nm and not more than 700 nm. The peak wavelength of the emitted light may be, for example, not less than 370 nm and not more than 480 nm.

The second semiconductor layer 20 includes, for example, a non-doped AlGaN spacer layer, a Mg-doped p-type AlGaN clad layer, a Mg-doped p-type GaN contact layer, and a high-concentration Mg-doped p-type GaN contact layer. The Mg-doped p-type GaN contact layer is disposed between the high-concentration Mg-doped p-type GaN contact layer and the light emitting layer 30. The Mg-doped p-type AlGaN clad layer is disposed between the Mg-doped p-type GaN contact layer and the light emitting layer 30. The non-doped AlGaN spacer layer is disposed between the Mg-doped p-type AlGaN clad layer and the light emitting layer 30. For example, the second semiconductor layer 20 includes a non-doped $Al_{0.11}Ga_{0.89}N$ spacer layer (e.g., having a thickness of 0.02 μm), a Mg-doped p-type $Al_{0.28}Ga_{0.72}N$ clad layer (having a Mg concentration of, for example, $1\times10^{19}$ cm$^{-3}$ and a thickness of, for example, 0.02 μm), a Mg-doped p-type GaN contact layer (e.g., having a Mg concentration of $1\times10^{19}$ cm$^{-3}$ and a thickness of 0.4 μm), and a high-concentration Mg-doped p-type GaN contact layer (having a Mg concentration of, for example, $5\times10^{19}$ cm$^{-3}$ and a thickness of, for example, 0.02 μm).

In the semiconductor layers recited above, the compositions, composition ratios, types of impurities, impurity concentrations, and thicknesses are examples; and various modifications are possible.

The first insulating portion 81 of the insulating unit 80 contacts a portion of the first surface 15a of the semiconductor light emitting unit 15 (i.e., the surface of the second semiconductor layer 20 on the first surface 15a side).

The third metal layer 53 is provided on the side of the first insulating portion 81 opposite to the semiconductor light emitting unit 15. In other words, the first insulating portion 81 is disposed between the third metal layer 53 and a portion of the semiconductor light emitting unit 15. It is favorable for the third metal layer 53 to have, for example, a high reflectance for the light emitted from the light emitting layer 30. The portion of the third metal layer 53 on the first insulating portion 81 side includes, for example, Ag, Al, or an alloy including at least one selected from Ag and Al. The light extraction efficiency can be increased by increasing the reflectance of the third metal layer 53. It is good for the thickness of the third metal layer 53 to be thicker than the reciprocal of the absorption coefficient. For example, in the case of Ag, such a thickness is not less than 20 nm and not more than 1000 nm, e.g., 200 nm.

In the example, the third metal layer 53 is electrically insulated from the second metal layer 52. In such a case, the potential of the third metal layer 53 may be, for example, fixed or grounded. The potential of the third metal layer 53 may be a floating potential. Also, in the embodiment, the third metal layer 53 may be electrically connected to the second metal layer 52. In the embodiment, the third metal layer 53 may be insulated from the second metal layer 52 and electrically connected to the electrode layer 40.

In the example, the third metal layer 53 is covered with the insulating unit 80. For example, the portion of the third metal layer 53 that does not contact the first insulating portion 81 is covered with the second insulating portion 82 or the third insulating portion 83.

The portions (the first to third insulating portions 81 to 83, etc.) of the insulating unit 80 may be formed of the same material. Or, the portions may be formed of mutually-different materials. The portions may be formed by the same method. Or, the portions may be formed by mutually-different methods. As described above, there are the cases where the boundaries between the portions are observed; and there are the cases where the boundaries between the portions are not observed.

For example, the thickness of the first insulating portion 81 is, for example, not less than 10 nm and not more than 2000 nm, e.g., 400 nm. The thickness of the second insulating portion 82 is, for example, not less than 10 nm and not more than 2000 nm, e.g., 600 nm. The thickness of the third insulating portion 83 is, for example, substantially the same as the thickness of the second insulating portion 82.

The second metal layer 52 contacts another portion of the first surface 15a (i.e., the surface of the second semiconductor layer 20 on the first surface 15a side) of the semiconductor light emitting unit 15. In the example, the second metal layer 52 includes the contact metal portion 52c and the peripheral metal portion 52p.

The contact metal portion 52c contacts the second semiconductor layer 20. For example, the contact metal portion 52c has an ohmic contact with the second semiconductor layer 20. It is favorable for the contact metal portion 52c to have high reflectance for the emitted light. The light extraction efficiency can be increased by increasing the reflectance of the contact metal portion 52c (the second metal layer 52). The contact metal portion 52c includes, for example, Ag. The thickness of the contact metal portion 52c is, for example, not less than 20 nm and not more than 1000 nm, e.g., about 200 nm.

The peripheral metal portion 52p covers, for example, at least a portion the contact metal portion 52c. The peripheral metal portion 52p is electrically connected to the contact metal portion 52c. The peripheral metal portion 52p covers the portion of the surface of the second semiconductor layer 20 (the first surface 15a of the semiconductor light emitting unit 15) not in contact with the contact metal portion 52c. A portion of the third metal layer 53 is disposed between a portion of the peripheral metal portion 52p and a portion of the semiconductor light emitting unit 15. In other words, a portion of the peripheral metal portion 52p extends on the side of the second insulating portion 82 opposite to the third metal layer 53. The outer edge of the peripheral metal portion 52p is positioned inside the outer edge of the semiconductor light emitting unit 15 when projected onto the X-Y plane.

It is favorable for the peripheral metal portion 52p to have high reflectance for the emitted light. The light extraction efficiency can be increased by increasing the reflectance of the peripheral metal portion 52p. The peripheral metal portion 52p includes, for example, Ag. The thickness of the peripheral metal portion 52p is, for example, not less than 20 nm and not more than 1000 nm, e.g., 200 nm.

The first metal layer 51 is provided on a side of the contact metal portion 52c opposite to the second semiconductor layer 20. In the example, the first metal layer 51 is electrically connected to the support substrate 64 via the bonding layer 63. The bonding layer 63 may be omitted. The first metal layer 51 overlaps the contact metal portion 52c and the peripheral metal portion 52p when projected onto the X-Y plane. The first metal layer 51 includes, for example, a stacked film of Ti/Pt/Au. In such a case, a Pt (platinum) film is disposed between the Au (gold) film and the semiconductor light emitting unit 15; and a Ti (titanium) film is disposed between the Pt film and the semiconductor light emitting unit 15.

The electrode layer 40 is electrically connected to, for example, an n-type GaN contact layer of the first semiconductor layer 10.

As shown in FIG. 1B, the electrode layer 40 is electrically connected to, for example, the pad portion 42 via a fine wire portion 43. The pad portion 42 is a region for forming a bonding pad. The size of the planar configuration of the pad portion 42 is, for example, not less than about 100 μm by 100 μm. By providing the fine wire portion 43, for example, the current can be spread to a wide region of the first semiconductor layer 10.

For example, the electrode layer 40 has an ohmic contact with the first semiconductor layer 10. At least the portion (the contact portion) of the electrode layer 40 that contacts the semiconductor light emitting unit 15 includes, for example, titanium (Ti) or an alloy including at least one selected from Ti and Al. The contact portion may include an oxide (e.g., indium tin oxide or ITO) that is electrically conductive and light-transmissive. These materials have good ohmic characteristics with the first semiconductor layer 10. However, the optical reflectances of these materials are relatively low.

At least the portion (the contact portion) of the electrode layer 40 that contacts the semiconductor light emitting unit 15 may include Al or Ag which has a high reflectance. Or, the contact portion may include an alloy including at least one selected from Al and Ag. The light extraction efficiency can be increased by increasing the reflectance of the electrode layer 40.

The bonding layer 63 includes, for example, a material that is different from that of the first metal layer 51. The bonding layer 63 includes, for example, solder of a AuSn alloy.

The support substrate 64 overlaps the first semiconductor layer 10 when projected onto the X-Y plane. The surface area of the support substrate 64 is not less than the surface area of the first semiconductor layer 10. The support substrate 64 includes, for example, a semiconductor substrate such as Si, etc. A metal substrate such as Cu, CuW, etc., may be used as the support substrate 64. The support substrate 64 may include a plating layer (a thick film plating layer). In other words, the support substrate 64 may be formed by plating. In such a case, the bonding layer 63 is omitted; and the thermal history that is added in the bonding process using the bonding layer 63 is eliminated. Therefore, the cost can be reduced; and thermal degradation also can be suppressed.

The back surface electrode 65 is provided on the side of the support substrate 64 opposite to the side of the semiconductor light emitting unit 15. The back surface electrode 65 includes, for example, a stacked film of Ti/Pt/Au. In such a case, a Pt film is disposed between the Au film and the support substrate 64; and a Ti film is disposed between the Pt film and the support substrate 64. The thickness of the back surface electrode 65 is, for example, not less than 100 nm and not more than 2000 nm, e.g., 800 nm.

As described below, the semiconductor light emitting unit 15 is obtained by growing a semiconductor stacked film that is used to form the semiconductor light emitting unit 15 on the growth substrate and by subsequently removing the growth substrate. In other words, for example, the growth substrate is removed from the second surface 15b of the first semiconductor layer 10.

As shown in FIG. 1A, an unevenness 14 is provided in the second surface 15b of the semiconductor light emitting unit 15 (i.e., the upper surface of the first semiconductor layer 10). The unevenness 14 includes multiple protrusions 14p. It is favorable for the distance between two adjacent protrusions 14p of the multiple protrusions 14p to be not less than the light emission wavelength of the emitted light radiated from the semiconductor light emitting unit 15. The light emission wavelength is the peak wavelength inside the semiconductor light emitting unit 15 (the first semiconductor layer 10). The light extraction efficiency is increased by providing such an unevenness 14.

In the case where the distance between the protrusions 14p is shorter than the light emission wavelength, the emitted light that is incident on the unevenness 14 exhibits behavior described by wave optics such as scattering, diffraction, etc., at the interface of the unevenness 14. Therefore, a portion of the emitted light at the unevenness 14 is no longer extracted. In the case where the distance between the protrusions 14p is even shorter, the unevenness 14 may be considered to be a layer of which the refractive index changes continuously. Therefore, similarly to a flat surface having no unevenness, the improvement effect of the light extraction efficiency is small.

The planar configuration of each of the multiple protrusions 14p of the unevenness 14 is, for example, a hexagon. For example, the unevenness 14 is formed by anisotropic etching of the first semiconductor layer 10 using, for example, a KOH solution. Thereby, the light emitted from the light emitting layer 30 has Lambertian reflectance at the interface between the first semiconductor layer 10 and the external environment.

The unevenness 14 may be formed by dry etching using a mask. Because the unevenness 14 can be formed as designed in this method, the reproducibility improves; and it is easy to increase the light extraction efficiency.

The semiconductor light emitting device 110 may further include an insulating layer (not shown) covering the side surface of the first semiconductor layer 10, the side surface of the light emitting layer 30, and the side surface of the second semiconductor layer 20. The insulating layer includes, for example, the same material as the first insulating portion 81. For example, the insulating layer includes $SiO_2$. The insulating layer functions as a protective layer of the semiconductor light emitting unit 15. Thereby, degradation and leaks of the semiconductor light emitting device 110 are suppressed.

The semiconductor light emitting device 110 may further include a sealing unit (not shown) covering the semiconductor light emitting unit 15. The sealing unit includes, for example, a resin. The sealing unit may include a wavelength conversion body. The wavelength conversion body absorbs a portion of the light emitted from the semiconductor light emitting device 110 and emits light of a wavelength (a peak wavelength) that is different from the wavelength (the peak wavelength) of the emitted light. The wavelength conversion body includes, for example, a fluorescer.

Figures 6A, 6B:
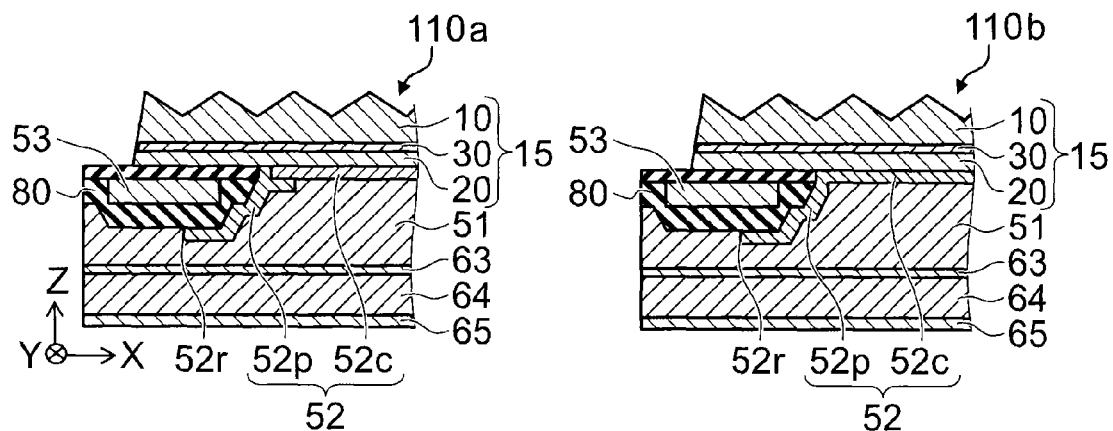
FIG. 6A and FIG. 6B are schematic cross-sectional views showing another semiconductor light emitting device according to the first embodiment.

FIG. 6A and FIG. 6B are schematic cross-sectional views illustrating another semiconductor light emitting device according to the first embodiment.

These drawings show a portion (the peripheral portion) of a cross section corresponding to the cross section along line A1-A2 of FIG. 1B.

In the semiconductor light emitting device 110a according to the embodiment as shown in FIG. 6A, the peripheral metal portion 52p covers a portion of the contact metal portion 52c. In the example, the peripheral metal portion 52p covers the peripheral portion of the contact metal portion 52c; and the central portion of the contact metal portion 52c contacts the first metal layer 51.

In the semiconductor light emitting device 110b according to the embodiment as shown in FIG. 6B, the peripheral metal portion 52p is integral with the contact metal portion 52c. The peripheral metal portion 52p is formed simultaneously with the contact metal portion 52c using the same material. In the semiconductor light emitting device 110b, for example, the processes are simplified; and, for example, the cost decreases.

An example of a method for manufacturing the semiconductor light emitting device 110 according to the embodiment will now be described.

For example, a buffer layer (not shown), the first semiconductor layer 10, the light emitting layer 30, and the second semiconductor layer 20 are formed sequentially on a growth substrate. Thereby, a semiconductor stacked film that is used to form the semiconductor light emitting unit 15 is formed. The formation is performed by, for example, epitaxial growth. The growth substrate includes, for example, a sapphire substrate. The growth substrate may include a silicon (Si) substrate.

A first $SiO_2$ film that is used to form the first insulating portion 81 is formed on the upper surface of the second semiconductor layer 20. The formation is performed by, for example, thermal CVD. The thickness of the first $SiO_2$ film is, for example, 400 nm.

A stacked film of Al/Ti that is used to form the third metal layer 53 is formed on the first SiO₂ film by, for example, vapor deposition. The thickness of the stacked film of Al/Ti is, for example, 200 nm. The third metal layer 53 is formed by patterning the stacked film of Al/Ti by lift-off.

A second SiO₂ film that is used to form the second insulating portion 82 and the third insulating portion 83 is formed by, for example, plasma CVD. The thickness of the second SiO₂ film is, for example, 600 nm. The second insulating portion 82 and the third insulating portion 83 are formed by removing a portion of the second SiO₂ film. Further, the first insulating portion 81 is formed by removing a portion of the first SiO₂ film.

The contact metal portion 52c is formed by, for example, lift-off in the region where the first SiO₂ film and the second SiO₂ film are removed. In such a case, for example, the contact metal portion 52c is obtained by forming a first Ag film that is used to form the contact metal portion 52c by, for example, vapor deposition, removing a portion of the first Ag film, and performing heat treatment for 1 minute in an oxygen atmosphere at 400° C. The thickness of the first Ag film is, for example, 200 nm.

Then, the peripheral metal portion 52p is formed by, for example, lift-off. At this time, the peripheral metal portion 52p is obtained by forming a second Ag film that is used to form the peripheral metal portion 52p by vapor deposition and by removing a portion of the second Ag film. The thickness of the second Ag film is, for example, 200 nm.

The first metal layer 51 is formed over the entire surface. Specifically, a stacked film of Ti/Pt/Au that is used to form the first metal layer 51 is formed by vapor deposition. The thickness of the first metal layer 51 is, for example, 200 nm.

For example, the support substrate 64 on which the bonding layer 63 is provided is prepared. The support substrate 64 includes, for example, a Si substrate having a thickness of 600 μm. The bonding layer 63 includes, for example, AuSn solder. The bonding layer 63 is caused to oppose the first metal layer 51; and the support substrate 64 is bonded to the patterning body recited above. For example, the bonding is performed by thermal compression bonding.

The growth substrate is removed. For example, laser lift-off is used in the case where the sapphire substrate is used as the growth substrate. In the laser lift-off, for example, the growth substrate and the semiconductor layer are separated by decomposing a portion of the GaN of the semiconductor layer by irradiating laser light. In the case where the Si substrate is used as the growth substrate, the removal is performed by, for example, polishing and dry etching. Combinations of these methods may be implemented.

The n-type GaN contact layer is exposed by removing the buffer layer by, for example, dry etching.

The semiconductor stacked body film is divided into multiple regions by removing a portion of the semiconductor stacked body film. Thereby, multiple device units are formed. The multiple device units are used to form the multiple semiconductor light emitting units 15, respectively.

The unevenness 14 is formed on the surface (the second surface 15b) of the semiconductor light emitting unit 15, i.e., the n-type GaN contact layer side of the first semiconductor layer 10. The unevenness 14 is formed by, for example, KOH processing or dry etching.

The electrode layer 40 is formed on the first semiconductor layer 10 (the n-type GaN contact layer). Namely, the electrode layer 40 is obtained by forming a stacked film of Al/Ni/Au that is used to form the electrode layer 40 by, for example, vapor deposition and by patterning the stacked film. The thickness of the electrode layer 40 is, for example, 2000 nm.

The thickness of the support substrate 64 is reduced to, for example, 150 μm by polishing the support substrate 64. The back surface electrode 65 on the polished surface of the support substrate 64 is formed. For example, a stacked film of Ti/Pt/Au that is used to form the back surface electrode 65 is formed by vapor deposition. The thickness of the back surface electrode 65 is, for example, 800 nm. Thus, the semiconductor light emitting device 110 is formed.

Figure 7A:
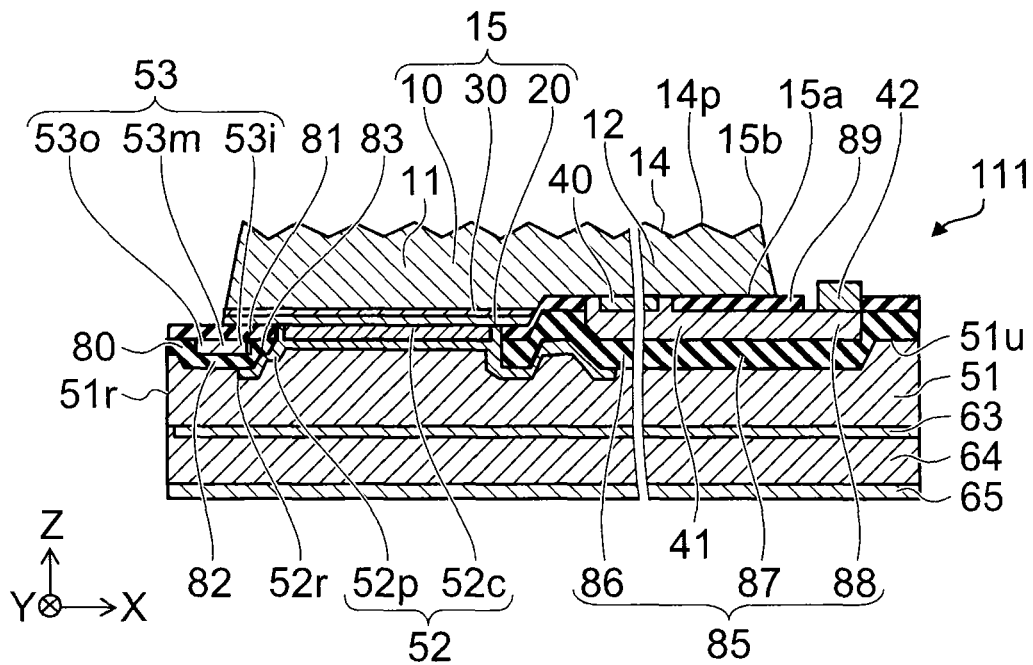
FIG. 7A and FIG. 7B are schematic views showing another semiconductor light emitting device according to the first embodiment.
Figure 7B:
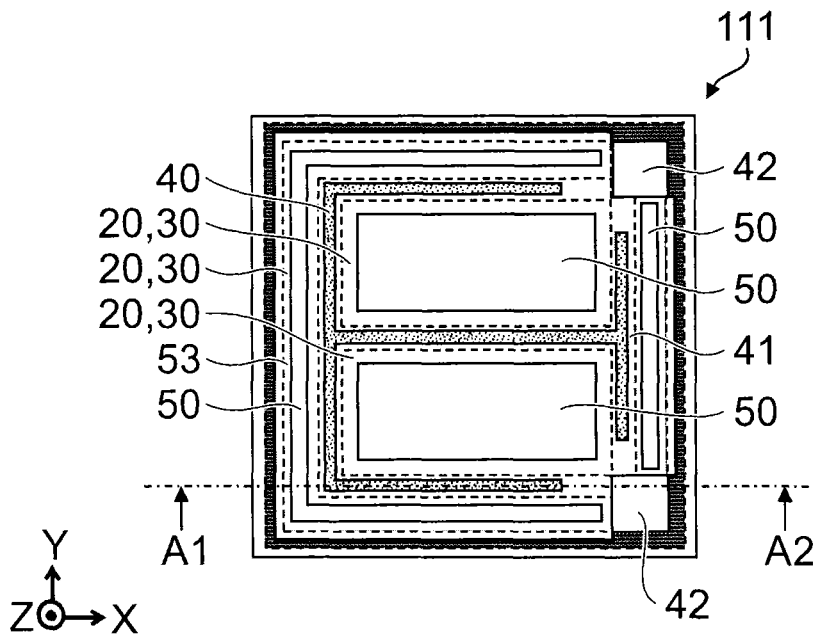

FIG. 7A and FIG. 7B are schematic views illustrating another semiconductor light emitting device according to the first embodiment.

FIG. 7B is a plan view; and FIG. 7A is a cross-sectional view along line A1-A2 of FIG. 7B. FIG. 7B is a schematic transparent view; and the insulating portions are not shown in FIG. 7B.

As shown in FIG. 7A and FIG. 7B, the first metal layer 51, the second metal layer 52, the third metal layer 53, the semiconductor light emitting unit 15, the insulating unit 80, the electrode layer 40, an interconnect layer 41, the pad portion 42, and an inter-layer insulating layer 85 are provided in the semiconductor light emitting device 111 according to the embodiment.

The cross-sectional structure of the peripheral portion of the semiconductor light emitting unit 15 of the semiconductor light emitting device 111 is similar to that of the semiconductor light emitting device 110.

In the semiconductor light emitting device 111, the electrode layer 40 is provided on the first surface 15a side of the semiconductor light emitting unit 15. The electrode layer 40 and the pad portion 42 are electrically connected to each other by the interconnect layer 41. The pad portion 42, the electrode layer 40, and the interconnect layer 41 are electrically insulated from the first metal layer 51.

In other words, the pad portion 42 is provided on the side of the first metal layer 51 at the surface (an upper surface 51u) of the first metal layer 51 opposing the semiconductor light emitting unit 15. The pad portion 42 does not overlap the semiconductor light emitting unit 15 when projected onto the X-Y plane.

In the example as well, the semiconductor light emitting unit 15 includes the first semiconductor layer 10 of the first conductivity type, the second semiconductor layer 20 of the second conductivity type, and the light emitting layer 30.

The first semiconductor layer 10 has a first semiconductor portion 11 and a second semiconductor portion 12. The second semiconductor portion 12 is arranged with the first semiconductor portion 11 in a direction parallel to the X-Y plane. The second semiconductor layer 20 is provided between the first semiconductor portion 11 and the second metal layer 52 (the contact metal portion 52c). The light emitting layer 30 is provided between the first semiconductor portion 11 and the second semiconductor layer 20.

The electrode layer 40 is provided between the second semiconductor portion 12 and the first metal layer 51. The electrode layer 40 is electrically connected to the second semiconductor portion 12.

The interconnect layer 41 is provided between the first metal layer 51 and the second semiconductor portion 12. The interconnect layer 41 electrically connects the electrode layer 40 to the pad portion 42.

The inter-layer insulating layer 85 has first to third inter-layer insulation portions 86 to 88. The inter-layer insulating layer 85 includes the same material as the insulating unit 80. At least a portion of the inter-layer insulating layer 85 may be formed together with at least a portion of the insulating unit 80.

The first inter-layer insulation portion 86 is provided between the electrode layer 40 and the first metal layer 51. The second inter-layer insulation portion 87 is provided between the interconnect layer 41 and the first metal layer 51. The third inter-layer insulation portion 88 is provided between the pad portion 42 and the first metal layer 51.

The pad portion 42, the electrode layer 40, and the interconnect layer 41 are electrically insulated from the first metal layer 51 by the inter-layer insulating layer 85.

A portion of the second metal layer 52 overlaps the electrode layer 40 when projected onto the X-Y plane. A portion of the second metal layer 52 may overlap at least one selected from the electrode layer 40 and the interconnect layer 41 when projected onto the X-Y plane. The semiconductor light emitting unit 15 overlaps at least one selected from the second metal layer 52, the third metal layer 53, the electrode layer 40, and the interconnect layer 41 when projected onto the X-Y plane. Thereby, a high light extraction efficiency is obtained.

In the example, the electrode layer 40 is reflective. For example, the electrode layer 40 includes at least one selected from Al and Ag.

It is favorable for the reflectance of the interconnect layer 41 to be high. For example, the interconnect layer 41 includes at least one selected from Al and Ag.

In the semiconductor light emitting device 111 as well, high light extraction is obtained; and peeling can be suppressed. A practical semiconductor light emitting device having high luminous efficiency can be provided.

In the semiconductor light emitting device 111, for example, the light output for a wavelength of 440 nm at a current of 350 mA is 470 mW. On the other hand, in the semiconductor light emitting device 118a of the first reference example, the light output is 420 mW. Thus, according to the embodiment, a light output that is 11% higher than that of the first reference example is obtained. Further, according to the embodiment, peeling does not occur.

In the semiconductor light emitting device 111, a light blocking film is not provided at the upper surface of the semiconductor light emitting unit 15. Therefore, the semiconductor light emitting device 111 obtains higher luminous efficiency.

As shown in FIG. 7A, the inter-layer insulating layer 85 may further include a fourth inter-layer insulation portion 89. The fourth inter-layer insulation portion 89 is provided between the interconnect layer 41 and the second semiconductor portion 12. By providing the fourth inter-layer insulation portion 89, the injection region into the first semiconductor layer 10 of the current supplied from the pad portion 42 (the current supplied from the electrode layer 40 and the interconnect layer 41) can be distal to the pad portion 42. Thereby, the light emitting region is distal to the pad portion 42 which has a relatively high optical absorptance. Thereby, the light extraction efficiency increases further.

Figure 8:
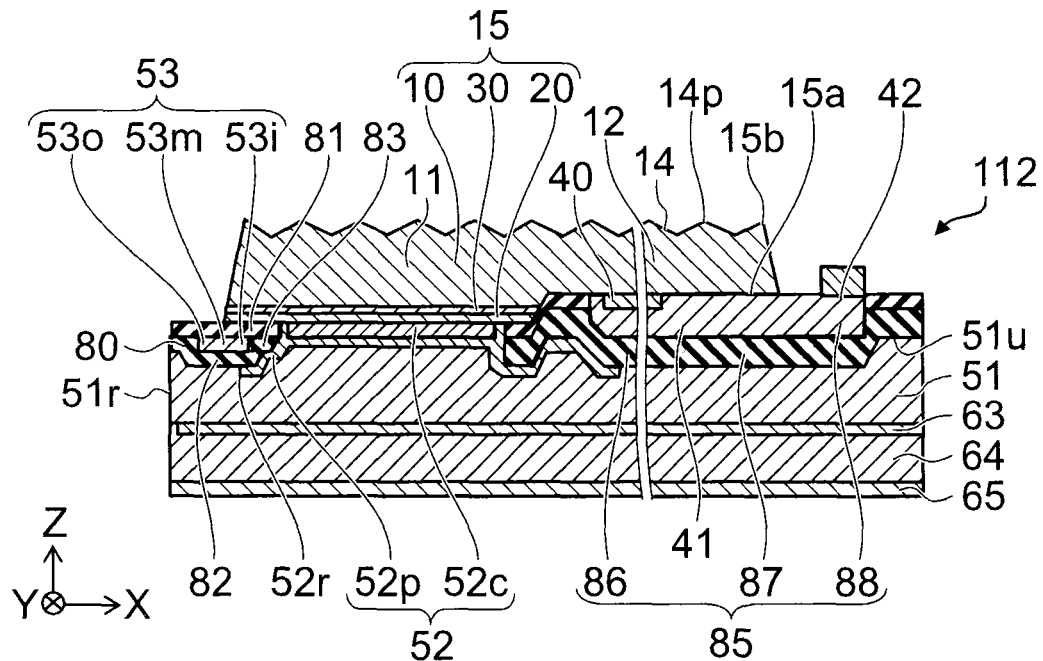
FIG. 8 is a schematic cross-sectional view showing another semiconductor light emitting device according to the first embodiment.

FIG. 8 is a schematic cross-sectional view illustrating another semiconductor light emitting device according to the first embodiment.

As shown in FIG. 8, the fourth inter-layer insulation portion 89 is not provided in the semiconductor light emitting device 112 according to the embodiment. Otherwise, the semiconductor light emitting device 112 is similar to the semiconductor light emitting device 111.

In the semiconductor light emitting device 112, the contact resistance between the interconnect layer 41 and the semiconductor light emitting unit 15 (in the example, the second semiconductor layer 20) is higher than the contact resistance between the electrode layer 40 and the semiconductor light emitting unit 15.

In the specification of the application, the state of the contact resistance being high includes the state of having an ohmic contact and a high electrical resistance and the state of having a non-ohmic contact (e.g., a Schottky contact).

For example, the interconnect layer 41 has a non-ohmic contact with the semiconductor light emitting unit 15. Thereby, the current flowing between the electrode layer 40 and the semiconductor light emitting unit 15 is larger than the current flowing between the interconnect layer 41 and the semiconductor light emitting unit 15. For example, a current substantially does not flow between the interconnect layer 41 and the semiconductor light emitting unit 15. Thereby, the current injection region is controlled; and the current injection region is distal to the pad portion 42. Thereby, the light extraction efficiency increases further.

Thus, a portion (e.g., at least one selected from the fourth inter-layer insulation portion 89 and the interconnect layer 41) that has an electrical resistance higher than the electrical resistance between the electrode layer 40 and the semiconductor light emitting unit 15 is provided in a region between the electrode layer 40 and the pad portion 42 when projected onto the X-Y plane. In such a case, the contact resistance between the interconnect layer 41 and the semiconductor light emitting unit 15 is higher than the contact resistance between the electrode layer 40 and the semiconductor light emitting unit 15. By such a configuration, a higher light extraction efficiency is obtained.

The configuration described in regard to the semiconductor light emitting device 110a or 110b is applicable to the second metal layer 52 of the semiconductor light emitting devices 111 and 112.

Second Embodiment

Figure 9:
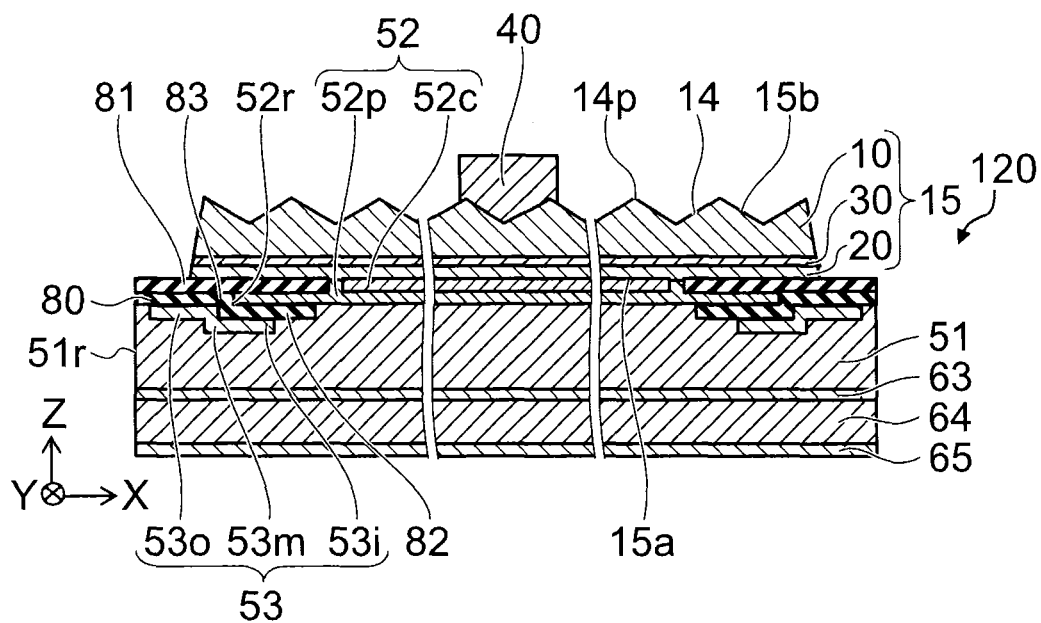
FIG. 9 is a schematic cross-sectional view showing a semiconductor light emitting device according to a second embodiment.

FIG. 9 is a schematic cross-sectional view illustrating a semiconductor light emitting device according to a second embodiment.

FIG. 9 is a cross-sectional view corresponding to the cross section along line A1-A2 of FIG. 1B.

In the semiconductor light emitting device 120 according to the embodiment, the configurations of the second metal layer 52, the third metal layer 53, and the insulating unit 80 are different from those of the semiconductor light emitting device 110. Otherwise, the configuration may be similar to that of the semiconductor light emitting device 110; and a description is therefore omitted. The second metal layer 52, the third metal layer 53, and the insulating unit 80 of the semiconductor light emitting device 120 will now be described.

In the semiconductor light emitting device 120 according to the embodiment as shown in FIG. 9, the third metal layer 53 is provided on a peripheral portion of the first metal layer 51. When projected onto the X-Y plane, the third metal layer 53 has a portion (the outer portion 53o) further on the outer side than is the outer edge of the semiconductor light emitting unit 15 and portions (the inner portion 53i and the middle portion 53m) further on the inner side than is the outer edge of the semiconductor light emitting unit 15. The second insulating portion 82 of the insulating unit 80 is provided on the third metal layer 53. The peripheral metal portion 52p (the outer edge portion 52r) of the second metal layer 52 is disposed on a portion of the second insulating portion 82. A portion (the inner portion 53i) of the third metal layer 53 overlaps the second metal layer 52 (at least a portion of the peripheral metal portion 52p) when projected onto the X-Y plane. The first insulating portion 81 is provided on a portion (on the outer side) of the second insulating portion 82 and on the peripheral metal portion 52*p* of the second metal layer 52. The first insulating portion 81 and the second insulating portion 82 are bonded to each other with the third insulating portion 83 interposed; and the first insulating portion 81 is continuous with the second insulating portion 82. The semiconductor light emitting unit 15 is provided on the first insulating portion 81 and on the second metal layer 52. The second insulating portion 82 is provided between the inner portion 53*i* and the outer edge portion 52*r* and between the outer edge portion 52*r* and the first metal layer 51. The end on the inner side of the second insulating portion 82 is inside the end on the inner side of the third metal layer 53.

In the example as well, the semiconductor light emitting unit 15 includes the first semiconductor layer 10, the second semiconductor layer 20 provided between the first semiconductor layer 10 and the first metal layer 51, and the light emitting layer 30 provided between the first semiconductor layer 10 and the second semiconductor layer 20. The unevenness 14 that includes the multiple protrusions 14*p* is provided on the upper surface (the second surface 15*b*) of the first semiconductor layer 10.

In the example as well, the support substrate 64 is provided on the back surface electrode 65; the bonding layer 63 is provided on the support substrate 64; and the first metal layer 51 is provided on the bonding layer 63.

The components (the layers recited above, etc.) may include the configurations and materials described in the first embodiment.

Thus, the semiconductor light emitting device 120 includes the first to third metal layers 51 to 53, the semiconductor light emitting unit 15, and the insulating unit 80. The semiconductor light emitting unit 15 is separated from the first metal layer 51 in the first direction (e.g., the Z-axis direction).

The second metal layer 52 is provided between the first metal layer 51 and the semiconductor light emitting unit 15. The second metal layer 52 is light-reflective. The second metal layer 52 contacts the first metal layer 51 and the semiconductor light emitting unit 15. The second metal layer 52 has the contact metal portion 52*c* and the peripheral metal portion 52*p*.

The contact metal portion 52*c* contacts the semiconductor light emitting unit 15. The peripheral metal portion 52*p* has the outer edge portion 52*r*. The outer edge portion 52*r* is provided around the contact metal portion 52*c* when projected onto the X-Y plane (the plane perpendicular to the first direction). In the example, the outer edge portion 52*r* is separated from the semiconductor light emitting unit 15.

The third metal layer 53 is provided between the first metal layer 51 and the semiconductor light emitting unit 15 and is light-reflective. The third metal layer 53 has the inner portion 53*i*, the middle portion 53*m*, and the outer portion 53*o*. The inner portion 53*i* is provided between the outer edge portion 52*r* and the first metal layer 51. The middle portion 53*m* overlaps the semiconductor light emitting unit 15 and does not overlap the outer edge portion 52*r* when projected onto the X-Y plane. The outer portion 53*o* is positioned outside the semiconductor light emitting unit 15 when projected onto the X-Y plane.

The insulating unit 80 has the first to third insulating portions 81 to 83.

The first insulating portion 81 is provided between the middle portion 53*m* and the semiconductor light emitting unit 15. In the example, the outer edge portion 52*r* is separated from the semiconductor light emitting unit 15; and the first insulating portion 81 extends between the outer edge portion 52*r* and the semiconductor light emitting unit 15.

The second insulating portion 82 is provided between the inner portion 53*i* and the outer edge portion 52*r* and between the outer edge portion 52*r* and the first metal layer 51.

The third insulating portion 83 is continuous from the first insulating portion 81 and the second insulating portion 82. The third insulating portion 83 is provided between the third metal layer 53 and the first insulating portion 81.

The semiconductor light emitting device 110 further includes the electrode layer 40. The semiconductor light emitting unit 15 is disposed between the electrode layer 40 and the contact metal portion 52*c*.

In the semiconductor light emitting device 120 according to the embodiment as well, the semiconductor light emitting unit 15 overlaps a reflective film having high reflectance (at least one selected from the second metal layer 52 and the third metal layer 53) when projected onto the X-Y plane. Therefore, the loss due to the emitted light reaching the first metal layer 51 which has a low reflectance is suppressed.

Further, a portion (the first insulating portion 81) of the insulating unit 80 that has high adhesion strength is bonded to the outer edge portion of the semiconductor light emitting unit 15. Also, another portion (the second insulating portion 82) of the insulating unit 80 is bonded to the first metal layer 51. The first insulating portion 81 and the second insulating portion 82 may be directly bonded to each other or may be bonded with the third insulating portion 83 interposed. Thereby, the occurrence of the peeling is suppressed.

Thus, in the embodiment as well, a practical semiconductor light emitting device having high luminous efficiency can be provided.

In the semiconductor light emitting device 120, at least a portion of the third metal layer 53 is disposed further on the first metal layer 51 side than is the second metal layer 52.

When projected onto the X-Y plane, the third metal layer 53 has a portion (the inner portion 53*i*) formed at a peripheral portion including the end portion of the semiconductor light emitting unit 15 in a region where the contact metal portion 52*c* does not contact the semiconductor light emitting unit 15.

The peripheral metal portion 52*p* contacts a portion of the first insulating portion 81 on the side opposite to the semiconductor light emitting unit 15. The outer edge of the peripheral metal portion 52*p* is positioned inside the outer edge of the semiconductor light emitting unit 15 when projected onto the X-Y plane.

The second insulating portion 82 contacts a portion of the second metal layer 52 on the side opposite to the first insulating portion 81. The third metal layer 53 contacts a portion of the second insulating portion 82 on the side opposite to the second metal layer 52. When projected onto the X-Y plane, the third metal layer 53 has a portion (the inner portion 53*i*) overlapping the second metal layer 52, a portion (the middle portion 53*m*) not overlapping the second metal layer 52 and overlapping the semiconductor light emitting unit 15, and a portion (the outer portion 53*o*) not overlapping the semiconductor light emitting unit 15.

In the example, the third metal layer 53 is electrically connected to the first metal layer 51.

An example of a method for manufacturing the semiconductor light emitting device 120 will now be described. Portions of the manufacturing method described in regard to the first embodiment or modifications of the manufacturing method described in regard to the first embodiment are applicable to portions of the manufacturing method described below.

A semiconductor stacked film that is used to form the semiconductor light emitting unit 15 is formed on a growth substrate. The upper surface of the semiconductor stacked film is used as the surface of the second semiconductor layer 20.

The first SiO$_2$ film that is used to form the first insulating portion 81 is formed on a portion of the second semiconductor layer 20. The formation is performed by, for example, thermal CVD. The thickness of the first SiO$_2$ film is, for example, 400 nm. The first insulating portion 81 is formed by removing a portion of the first SiO$_2$ film.

The contact metal portion 52c is formed by, for example, lift-off in the region where the first SiO$_2$ film is removed. For example, the contact metal portion 52c is formed by forming the first Ag film (having a thickness of 200 nm) that is used to form the contact metal portion 52c by vapor deposition, patterning the first Ag film, and performing heat treatment for 1 minute in an oxygen atmosphere at 400° C.

The peripheral metal portion 52p is formed by forming the second Ag film (having a thickness of 200 nm) that is used to form the peripheral metal portion 52p by, for example, vapor deposition and by patterning the second Ag film. For example, lift-off is used to pattern the second Ag film. A portion of the peripheral metal portion 52p covers a portion of the first insulating portion 81.

The second SiO$_2$ film (having a thickness of 600 nm) that is used to form the second insulating portion 82 and the third insulating portion 83 is formed by, for example, plasma CVD. The second insulating portion 82 and the third insulating portion 83 are formed by removing the second SiO$_2$ film provided on the contact metal portion 52c to leave the contact metal portion 52c (and/or the peripheral metal portion 52p) exposed.

For example, the third metal layer 53 is formed by lift-off. In other words, for example, the third metal layer 53 is formed by forming a stacked film of Al/Ti by vapor deposition and by patterning the stacked film. The thickness of the third metal layer 53 is, for example, 200 nm.

The first metal layer 51 is formed over the entire surface. Namely, a stacked film of Ti/Pt/Au that is used to form the first metal layer 51 is formed by, for example, vapor deposition. The thickness of the first metal layer 51 is, for example, 200 nm.

Thereafter, the semiconductor light emitting device 120 is formed by implementing processes that are similar to those described in regard to the first embodiment.

Figure 10:
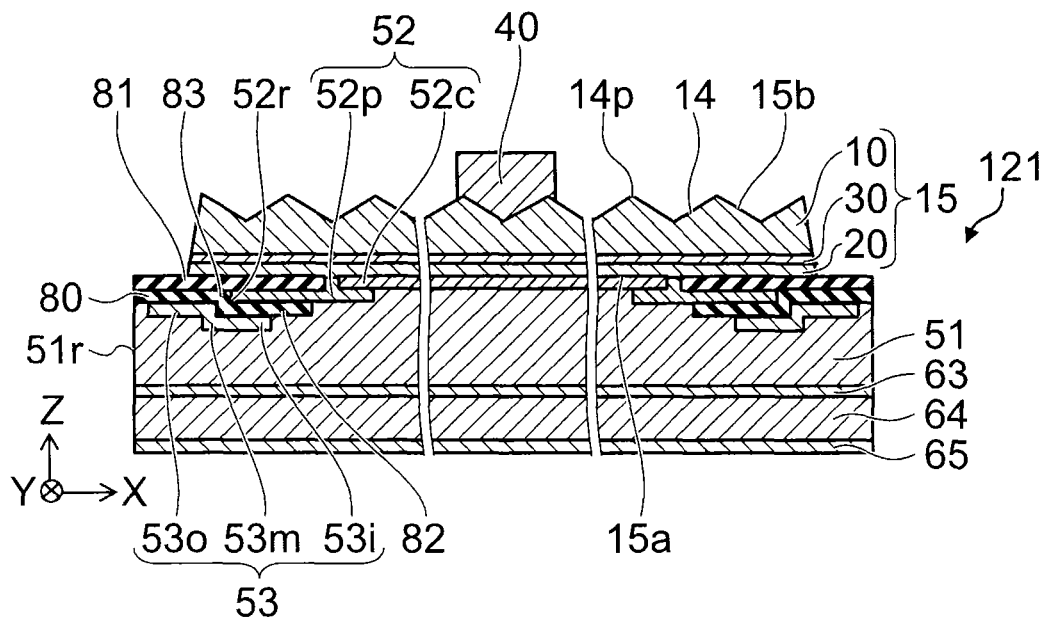
FIG. 10 is a schematic cross-sectional view showing another semiconductor light emitting device according to the second embodiment.

FIG. 10 is a schematic cross-sectional view illustrating another semiconductor light emitting device according to the second embodiment. FIG. 10 is a cross-sectional view corresponding to the cross section along line A1-A2 of FIG. 1B.

In the semiconductor light emitting device 121 according to the embodiment as shown in FIG. 10, the peripheral metal portion 52p is provided along the outer edge of the contact metal portion 52c; and the peripheral metal portion 52p is not provided on the central portion of the contact metal portion 52c. A portion (the central portion) of the contact metal portion 52c contacts the first metal layer 51. Otherwise, the semiconductor light emitting device 121 is the same as the semiconductor light emitting device 120. In the semiconductor light emitting device 121 as well, a practical semiconductor light emitting device having high luminous efficiency can be provided.

Figure 11:
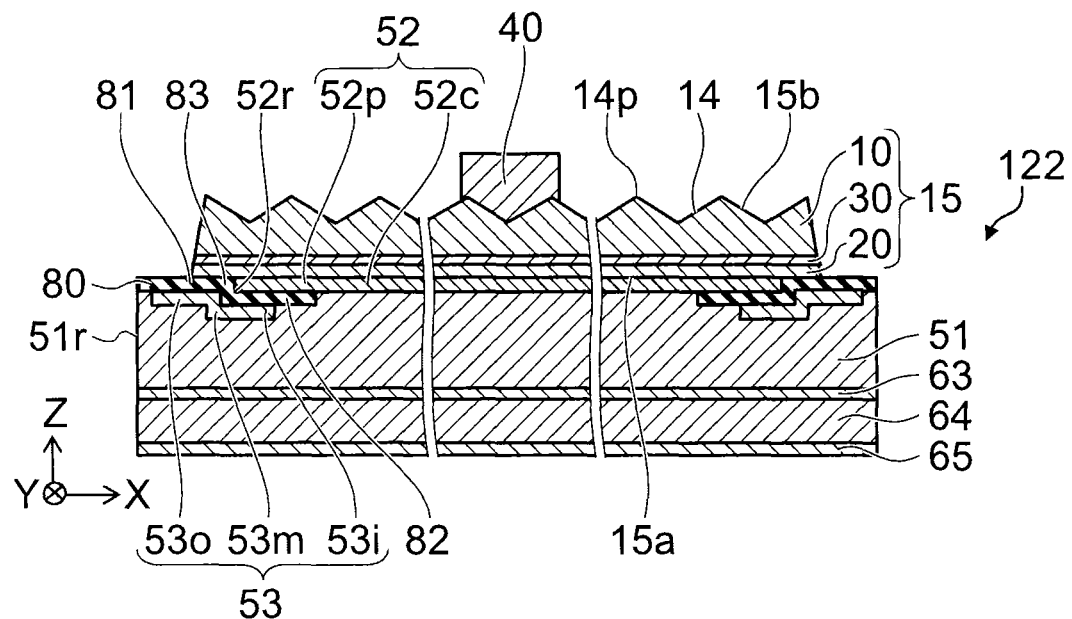
FIG. 11 is a schematic cross-sectional view showing another semiconductor light emitting device according to the second embodiment.

FIG. 11 is a schematic cross-sectional view illustrating another semiconductor light emitting device according to the second embodiment. FIG. 11 is a cross-sectional view corresponding to the cross section along line A1-A2 of FIG. 1B.

In the semiconductor light emitting device 122 according to the embodiment as shown in FIG. 11, the outer edge portion 52r of the peripheral metal portion 52p of the second metal layer 52 contacts the semiconductor light emitting unit 15. Also, the insulating unit 80 covers the peripheral metal portion 52p of the second metal layer 52. Otherwise, the semiconductor light emitting device 122 is similar to the semiconductor light emitting device 120; and a description is therefore omitted.

In the semiconductor light emitting device 122 as well, the first insulating portion 81 of the insulating unit 80 is provided between the middle portion 53m and the semiconductor light emitting unit 15. The first insulating portion 81 also is provided between the outer portion 53o and the semiconductor light emitting unit 15. The second insulating portion 82 is provided between the inner portion 53i and the outer edge portion 52r and between the outer edge portion 52r and the first metal layer 51. The third insulating portion 83 is continuous with the first insulating portion 81 and the second insulating portion 82 and is provided between the third metal layer 53 and the first insulating portion 81.

In the semiconductor light emitting device 122 as well, a practical semiconductor light emitting device having high luminous efficiency can be provided.

In the semiconductor light emitting device 122, the second metal layer 52 (the contact metal portion 52c) contacts the first metal layer 51. Therefore, the heat dissipation of the semiconductor light emitting device 122 is higher than that of the semiconductor light emitting device 118d of the fourth reference example. Because the heat dissipation is good, high luminous efficiency is obtained.

In the case where the heat dissipation is poor, the temperature easily increases locally due to the heat generated at the light emitting layer 30. When the temperature increases, the resistivity of the semiconductor layer decreases; the current density increases; more light emission occurs; and more heat is generated. The degradation of the device progresses by repeating such a cycle. In the semiconductor light emitting device 122, the degradation of the device can be suppressed because the heat dissipation is good.

In the semiconductor light emitting device 122, the contact resistance between the peripheral metal portion 52p and the semiconductor light emitting unit 15 (in the example, the second semiconductor layer 20) may be set to be higher than the contact resistance between the contact metal portion 52c and the semiconductor light emitting unit 15. Thereby, the light emission in the region where the insulating unit 80 is provided between the semiconductor light emitting unit 15 and the first metal layer 51 can be suppressed; and the amount of heat generated at the peripheral metal portion 52p which has poor heat dissipation can be reduced. Thereby, the life can be longer.

For the second metal layer 52, the peripheral metal portion 52p may be formed from the film used to form the contact metal portion 52c. In other words, these portions may be formed from the same film. Thereby, the number of processes decreases; and the cost can be reduced.

In the semiconductor light emitting devices according to the first and second embodiments, the buffer layer that is formed on the growth substrate may include, for example, a thin film of Al$_x$Ga$_{1-x}$N (0≤x≤1) having low temperature growth.

The second metal layer 52 includes, for example, silver or an alloy of silver. The reflectance for the visible light band of films of metals other than silver have a tendency to decrease as the wavelength shortens in the ultraviolet region of 400 nm or less. On the other hand, silver has a high reflection efficiency even for light of the ultraviolet band not less than 370 nm and not more than 400 nm. For example, in the case where the semiconductor light emitting device is an ultraviolet light emitting semiconductor light emitting device and a silver alloy is used as the second metal layer 52, it is favorable for the component ratio of silver to be high at the interface portion between the second metal layer 52 and the semiconductor light emitting unit 15. It is favorable for the thickness of the second metal layer 52 (e.g., the contact metal portion 52c) to be 100 nm or more to ensure the reflection efficiency for the light.

For example, defects or damage occurs easily in the semiconductor layer (the crystal) in the bonding between the semiconductor light emitting unit 15 and the support substrate 64 or in the removal (e.g., the laser lift-off) of the growth substrate. The defects or damage is caused by, for example, the coefficient of thermal expansion difference between the support substrate 64 and the semiconductor light emitting unit 15, the coefficient of thermal expansion difference between the support substrate 64 and the growth substrate, heat due to localized heating, products due to the decomposition of the GaN during the laser lift-off, etc. In the case where defects or damage occurs in the semiconductor layer, for example, the Ag of the second metal layer 52 diffuses from the defects or damage; leaks occur in the crystal interior; or the crystal defects increase acceleratingly.

In the embodiment, for example, a monocrystalline AlN buffer layer is used. Thereby, a high-quality semiconductor layer can be formed. Therefore, the damage of the crystal is drastically reduced. The thermal conductivity of the monocrystalline AlN buffer layer is high. Therefore, the heat diffuses efficiently to the monocrystalline AlN buffer layer disposed in the vicinity of the GaN layer when decomposing the GaN layer with the laser light. Therefore, the thermal damage due to localized heat does not occur easily.

The unevenness 14 may be formed in the buffer layer (e.g., the GaN buffer layer). The n-type contact layer has a low-resistance ohmic connection with the electrode layer 40. Therefore, the carrier concentration (e.g., the impurity concentration) of the n-type contact layer is set to be high. In the case where the unevenness 14 is formed in the n-type contact layer, the flatness of the surface degrades easily; and impurity precipitation occurs easily. As a result, there are cases where the light extraction efficiency decreases. On the other hand, the carrier concentration (e.g., the impurity concentration) of the buffer layer (the GaN buffer layer) is lower than that of the n-type contact layer. Therefore, by forming the unevenness 14 in the buffer layer (e.g., the GaN buffer layer), the flatness of the surface is maintained; and the impurity precipitation does not occur easily.

For example, wet etching or dry etching may be used to form the unevenness 14. For example, anisotropic etching occurs along the plane orientation (mainly {10-1-1}) of the GaN crystal by alkaline etching using a KOH solution, etc. As a result, a hexagonal pyramid structure is formed. The etching rate is changed by the temperature, time, pH (adjusted by adding another substance), and concentration of the etching, the irradiation/non-irradiation of UV light, a UV laser, etc. By such conditions, the size and/or density of the hexagonal pyramid changes greatly. Generally, the unevenness 14 is large and is formed densely as the etching amount (the depth from the surface prior to the etching to the deepest location of the unevenness 14 after the etching) increases.

In the case where the GaN is patterned by dry etching, the N surface is different from the Ga surface in that the N surface is easily affected by the crystal orientation and/or dislocations and is easily subjected to anisotropic etching. Normally, the surface of the GaN that is grown on a c-plane sapphire substrate is the Ga surface. For example, the surface of the GaN that is exposed by removing the growth substrate (e.g., the sapphire substrate) is the N surface. Therefore, the unevenness 14 can be formed easily by anisotropic etching by dry etching. The unevenness 14 may be formed by dry etching using a mask. In such a case, it is easy to increase the light extraction efficiency because it is easy to form the unevenness 14 as designed.

The unevenness 14 can effectively extract the emitted light that is incident or can change the incident angle. It is favorable for the size of the unevenness 14 (the distance along the Z-axis direction between two adjacent protrusions 14p) to be not less than the light emission wavelength inside the crystal layer. According to experiments of the inventor of the application, there is a tendency for the light output to increase in the case where the unevenness 14 is large in a semiconductor light emitting device having a light emission wavelength of 390 nm (the light emission wavelength inside the crystal layer being about 155 nm). In the case where the size of the unevenness 14 is not less than the light emission wavelength and not more than about 3 μm, the light output increases gradually when the size of the unevenness 14 is large. It is favorable for the size of the unevenness 14 to be not less than twice the light emission wavelength inside the crystal layer, and more favorable to be not less than 10 times the light emission wavelength inside the crystal layer.

In the semiconductor light emitting device according to the embodiment, the method for growing the semiconductor layer may include, for example, metal-organic chemical vapor deposition (MOCVD), metal-organic vapor phase epitaxy, etc.

According to the embodiments, a practical semiconductor light emitting device having high luminous efficiency can be provided.

In the specification, "nitride semiconductor" includes all compositions of semiconductors of the chemical formula $B_x In_y Al_z Ga_{1-x-y-z} N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the semiconductor light emitting device such as the first to third metal layers, the semiconductor light emitting unit, the first semiconductor layer, the second semiconductor layer, the light emitting layer, the insulating unit, the first to third insulating portions, the electrode layer 40, the pad portion, the interconnect layer, the inter-layer insulating layer, the first to fourth inter-layer insulation portions, the bonding layer, the support substrate, the back surface electrode, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   a first metal layer;
   a semiconductor light emitting unit separated from the first metal layer in a first direction, the semiconductor light emitting unit including:
      a first semiconductor layer of a first conductivity type,
      a second semiconductor layer provided between a part of the first semiconductor layer and the first metal layer, and
      a light emitting layer provided between the part of the first semiconductor layer and the second semiconductor layer;
   a second metal layer provided between the first metal layer and the semiconductor light emitting unit to be electrically connected to the first metal layer, the second metal layer being light-reflective, the second metal layer including:
      a contact metal portion contacting the second semiconductor layer, and
      a peripheral metal portion provided around the contact metal portion when projected onto a plane perpendicular to the first direction, the peripheral metal portion having an outer edge portion separated from the semiconductor light emitting unit;
   a third metal layer that is light-reflective, the third metal layer including:
      an inner portion provided between the semiconductor light emitting unit and the outer edge portion,
      a middle portion overlapping the semiconductor light emitting unit and not overlapping the outer edge portion when projected onto the plane, and
      an outer portion outside the semiconductor light emitting unit when projected onto the plane, the middle portion being provided between the inner portion and the outer portion;
   an insulating unit including:
      a first insulating portion provided between the middle portion and the semiconductor light emitting unit and between the inner portion and the semiconductor light emitting unit,
      a second insulating portion provided between the inner portion and the first metal layer and between the outer portion and the first metal layer, and
      a third insulating portion continuous with the first insulating portion and the second insulating portion; and
   an electrode layer electrically connected to the first semiconductor layer, wherein
   the semiconductor light emitting unit has a first surface on a side of the first metal layer and a second surface opposite to the first surface, the second surface having a plurality of protrusions, and
   the third metal layer is connected to one of the second metal layer and the electrode layer.

2. The device according to claim 1, wherein the semiconductor light emitting unit is disposed between the electrode layer and the first metal layer.

3. The device according to claim 1, wherein the electrode layer includes at least one selected from aluminum and silver.

4. The device according to claim 1, further comprising:
   a pad portion provided to be electrically insulated from the first metal layer on a side of the first metal layer at a surface of the first metal layer opposing the semiconductor light emitting unit;
   an interconnect layer electrically insulated from the first metal layer; and
   an inter-layer insulating layer,
   the electrode layer being electrically insulated from the first metal layer,
   the semiconductor light emitting unit including:
      the first semiconductor layer of the first conductivity type having a first semiconductor portion and a second semiconductor portion arranged with the first semiconductor portion in a direction parallel to the plane;
      the second semiconductor layer provided between the first semiconductor portion and the contact metal portion; and
      the light emitting layer provided between the first semiconductor portion and the second semiconductor layer,
   the electrode layer being provided between the second semiconductor portion and the first metal layer to be electrically connected to the second semiconductor portion,
   the interconnect layer being provided between the first metal layer and the second semiconductor portion to be electrically connected to the electrode layer and the pad portion,
   the inter-layer insulating layer including:
      a first inter-layer insulation portion provided between the electrode layer and the first metal layer;
      a second inter-layer insulation portion provided between the interconnect layer and the first metal layer; and
      a third inter-layer insulation portion provided between the pad portion and the first metal layer.

5. The device according to claim 4, wherein a portion of the second metal layer overlaps at least one selected from the electrode layer and the interconnect layer when projected onto the plane.

6. The device according to claim 4, wherein the inter-layer insulating layer further has a fourth inter-layer insulation portion provided between the interconnect layer and the second semiconductor portion.

7. The device according to claim 4, wherein the third metal layer is electrically connected to one selected from the first metal layer and the electrode layer.

8. The device according to claim 4, wherein the electrode layer includes at least one selected from aluminum and silver.

9. The device according to claim 1, wherein the third metal layer includes at least one selected from aluminum and silver.

10. The device according to claim 1, wherein an intensity of light emitted from the semiconductor light emitting unit to be emitted from a surface of the semiconductor light emitting unit on a side of the semiconductor light emitting unit opposite to the first metal layer is higher than an intensity of the light emitted from the semiconductor light emitting unit to be emitted from a surface of the semiconductor light emitting unit on a side of the first metal layer.

11. The device according to claim 1, further comprising a substrate, the substrate being electrically conductive,
wherein the first metal layer is disposed between the substrate and the semiconductor light emitting unit, the substrate and the second metal layer being electrically connected to each other via the first metal layer.

12. The device according to claim 1, wherein
the outer portion is disposed between the first insulating portion and the first metal layer, and
the outer portion is disposed between the first insulating portion and the second insulating portion.

13. The device according to claim 1, wherein an adhesion between the insulating unit and the semiconductor light emitting unit is higher than an adhesion between the third metal layer and the semiconductor light emitting unit.

14. The device according to claim 1, wherein an adhesion between the insulating unit and the first metal layer is higher than an adhesion between the insulating unit and the third metal layer.

15. The device according to claim 1, wherein the insulating unit includes at least one selected from silicon oxide, silicon nitride, and silicon oxynitride.

16. The device according to claim 1, wherein
an optical reflectance of the second metal layer is higher than an optical reflectance of the first metal layer, and
an optical reflectance of the third metal layer is higher than the optical reflectance of the first metal layer.

17. The device according to claim 1, wherein a distance between two adjacent protrusions is not less than a peak wavelength of a light emitted from the semiconductor light emitting unit.

18. The device according to claim 1, wherein the peripheral metal portion physically contacts the second semiconductor layer.

19. The device according to claim 1, wherein a position of the third metal layer in the first direction is between a position of the semiconductor light emitting unit in the first direction and a position of the second insulating portion in the first direction.

* * * * *